United States Patent
Kutsukake et al.

(10) Patent No.: US 11,127,748 B2
(45) Date of Patent: Sep. 21, 2021

(54) SEMICONDUCTOR DEVICE HAVING CONTACT ELECTRODE EXTENDING THROUGH VOID

(71) Applicant: Toshiba Memory Corporation, Tokyo (JP)

(72) Inventors: Shizuka Kutsukake, Yokkaichi Mie (JP); Hiroshi Matsumoto, Yokkaichi Mie (JP); Hiroto Saito, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,507

(22) Filed: Sep. 3, 2019

(65) Prior Publication Data

US 2020/0286904 A1 Sep. 10, 2020

(30) Foreign Application Priority Data

Mar. 5, 2019 (JP) .............................. JP2019-040044

(51) Int. Cl.
| | |
|---|---|
| *H01L 27/11529* | (2017.01) |
| *H01L 27/11556* | (2017.01) |
| *H01L 27/11524* | (2017.01) |
| *H01L 23/522* | (2006.01) |

(52) U.S. Cl.
CPC .... *H01L 27/11529* (2013.01); *H01L 23/5226* (2013.01); *H01L 27/11524* (2013.01); *H01L 27/11556* (2013.01)

(58) Field of Classification Search
CPC ......... H01L 27/11529; H01L 27/11556; H01L 27/11524; H01L 23/5226; H01L 21/76831; H01L 23/485; H01L 2221/1063; H01L 21/76804; H01L 23/53295; H01L 23/5222; H01L 21/7682; H01L 27/112–11597;

(Continued)

(56) References Cited

U.S. PATENT DOCUMENTS

| | | | |
|---|---|---|---|
| 6,215,187 B1 * | 4/2001 | Ooto | ................ H01L 21/31111 |
| | | | 257/516 |
| 6,492,245 B1 | 12/2002 | Liu et al. | |
| 9,024,390 B2 | 5/2015 | Miyajima | |

(Continued)

FOREIGN PATENT DOCUMENTS

| | | |
|---|---|---|
| JP | 2003-163266 A | 6/2003 |
| JP | 2015-061032 | 3/2015 |

(Continued)

*Primary Examiner* — Shahed Ahmed
(74) *Attorney, Agent, or Firm* — Kim & Stewart LLP

(57) ABSTRACT

A semiconductor device includes a substrate, a first insulating layer, a second insulating layer above the first insulating layer, a void space between the first and second insulating layers, and contact electrodes extending through the first insulating layer, the void space, and the second insulating layer. Each of the contact electrodes includes a first end facing the substrate, a second end opposite to the first end, and a first width portion between the first end and the second end. The first width portion has a width in a second direction parallel to the substrate that is greater than a width of the first end in the second direction and a width of the second end in the second direction. The first width portion is within the void space.

20 Claims, 42 Drawing Sheets

(58) Field of Classification Search
CPC ......... H01L 27/11582; H01L 27/11548; H01L 27/11575
See application file for complete search history.

(56) References Cited

U.S. PATENT DOCUMENTS

| | | | |
|---|---|---|---|
| 9,905,510 B2 | 2/2018 | Komori | |
| 2006/0186453 A1 | 8/2006 | Park | |
| 2007/0123031 A1* | 5/2007 | Isogai | H01L 28/91 438/624 |
| 2014/0210087 A1* | 7/2014 | Kang | H01L 23/528 257/751 |
| 2015/0349109 A1* | 12/2015 | Lee | H01L 23/528 257/314 |
| 2016/0099256 A1* | 4/2016 | Okamoto | H01L 27/11575 257/324 |
| 2016/0268304 A1 | 9/2016 | Ikeda et al. | |
| 2017/0062470 A1* | 3/2017 | Han | H01L 23/53266 |
| 2017/0154894 A1 | 6/2017 | Yoshimizu et al. | |
| 2019/0214405 A1 | 7/2019 | Shirai et al. | |
| 2020/0075417 A1* | 3/2020 | Lee | H01L 21/823468 |

FOREIGN PATENT DOCUMENTS

| | | |
|---|---|---|
| JP | 2016-171243 A | 9/2016 |
| TW | 201814872 A | 4/2018 |

* cited by examiner

SEMICONDUCTOR DEVICE HAVING CONTACT ELECTRODE EXTENDING THROUGH VOID

CROSS-REFERENCE TO RELATED APPLICATION

This application is based upon and claims the benefit of priority from Japanese Patent Application No. 2019-040044, filed Mar. 5, 2019, the entire contents of which are incorporated herein by reference.

FIELD

Embodiments described herein relate generally to a semiconductor device.

BACKGROUND

As semiconductor devices become more highly integrated, the use contacts having a high aspect ratio is increasing. For example, in a three-dimensional memory device in which memory cells are stacked on a substrate is known. In a three-dimensional memory, the aspect ratios of contacts connecting a memory cell array to a peripheral circuit and contacts used in forming the peripheral circuit are increasing.

DETAILED DESCRIPTION

Figure 1:
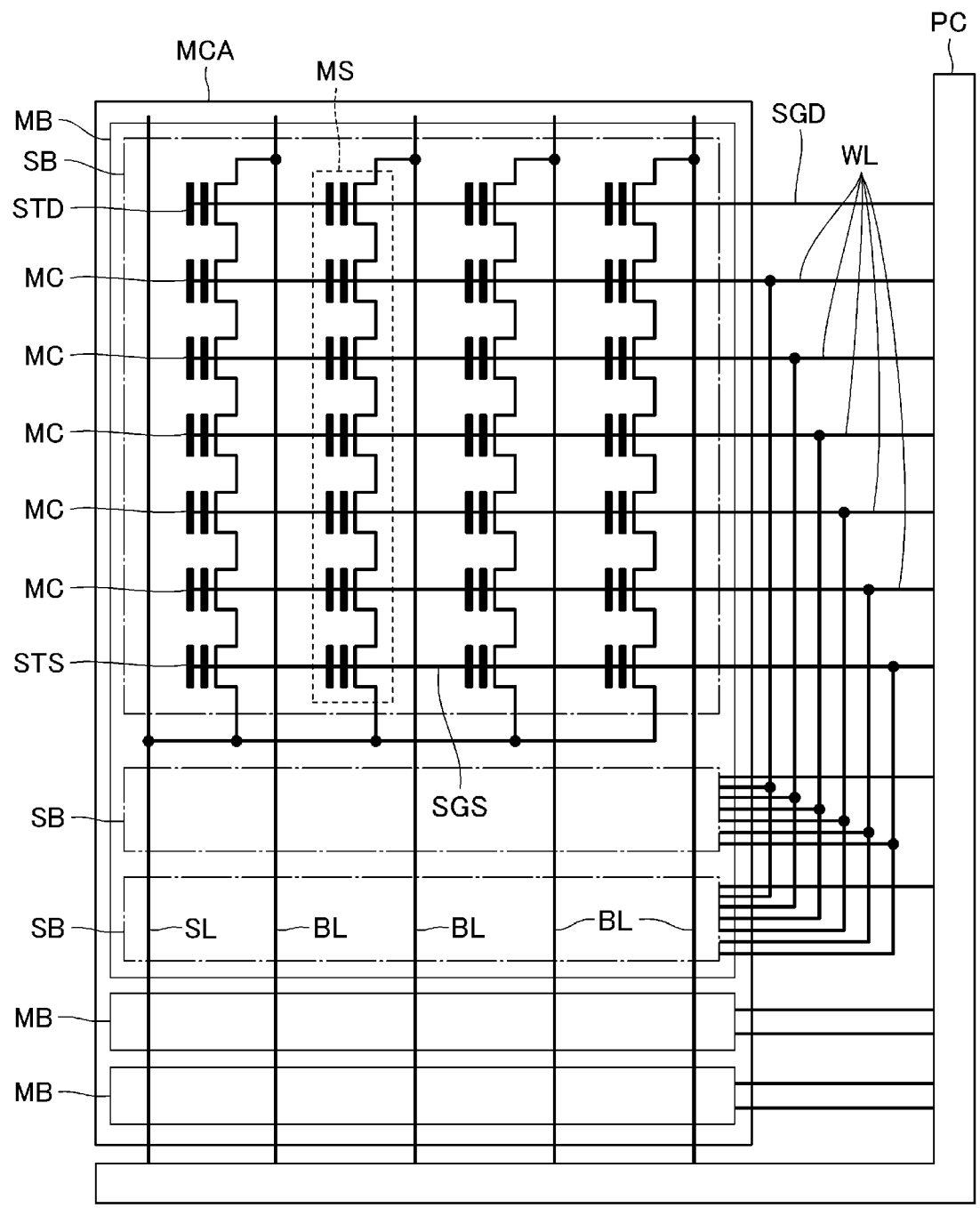
FIG. 1 is an equivalent circuit diagram illustrating a schematic configuration of a semiconductor storage device according to a first embodiment.

Example embodiments provide semiconductor storage devices having high integration and high processing speed.

In general, according to an embodiment, a semiconductor storage device includes a substrate, a first insulating layer above the substrate, a second insulating layer above the first insulating layer, and a void space between the first insulating layer and the second insulating layer. A plurality of contact electrodes extend, in a first direction orthogonal to the substrate, through the first insulating layer, the void space, and the second insulating layer. Each of the contact electrodes includes a first end facing the substrate, a second end opposite to the first end, and a first width portion between the first end and the second end. The first width portion has a width in a second direction parallel to the substrate that is greater than a width of the first end in the second direction and a width of the second end in the second direction. The first width portion is within the void space.

According to another embodiment, a semiconductor device includes a substrate, an insulating layer above the substrate in a first direction, and a void between the substrate and the insulating layer in the first direction. A plurality of contact electrodes is arranged in a second direction intersecting the first direction. Each of the contact electrodes extends in the first direction through at least part of the insulating layer. Each of the contact electrodes includes a first end facing the substrate, a second end opposite to the first end, and a first width portion between the first end and the second end. The first width portion has a width in the second direction greater than a width of the first end in the second direction and a width of the second end in the second direction.

Next, a semiconductor device and a semiconductor storage device according to example embodiments will be described with reference to the drawings. The following embodiments are merely examples, and are not limiting of the present disclosure.

In the present specification, one direction parallel to a surface of a semiconductor substrate is referred to as the X-direction, another direction parallel to the surface of the semiconductor substrate and perpendicular to the X-direction is referred to as the Y-direction, and a direction orthogonal to the surface of the semiconductor substrate is referred to as the Z-direction.

In the present disclosure, a direction along a plane may be referred to as a first direction, and a direction intersecting the first direction and parallel to the plane may be referred to as a second direction, and a direction intersecting the plane may be referred to as a third direction. The first direction, the second direction, and the third direction may or may not correspond to any of the X-direction, the Y-direction, and the Z-direction.

In the present disclosure, expressions such as "upper" and "lower" are relative to a semiconductor substrate or the like. For example, when the first direction intersects the surface of the semiconductor substrate, a direction facing away from the semiconductor substrate along the first direction is referred to as the "upper", and a direction facing towards the semiconductor substrate along the first direction is referred to as the "lower". In addition, when referring to a lower surface or a lower end portion in a certain configuration, it means a surface or an end portion on the semiconductor substrate side, and when referring to an upper surface or an upper end portion, it means a surface or an end portion on a side opposite to the semiconductor substrate of this configuration. Furthermore, any surface intersecting the second direction or the third direction can be referred to as a side surface, a side wall, or the like.

Further, in the present disclosure, when a "radial direction" is referenced for a cylinder, annular element, or a hole (e.g., a through via hole or the like), then this radial direction is in a plane orthogonal to the central axis of the cylinder, annulus, or hole, and it refers to a direction perpendicular to this central axis. Also, when a "thickness in the radial direction" or the like is referred to, it refers to a thickness of the element from an inner diameter position (if present, the central axis position otherwise) of the element to an outer diameter of the element.

In the present disclosure, when a "width" or "thickness" in a predetermined direction is referred to it may mean the width or thickness in a cross section or the like as observed or observable by scanning electron microscopy (SEM), transmission electron microscopy (TEM), or the like.

First Embodiment

Overall Configuration

Hereinafter, with reference to the drawings, a semiconductor storage device will be described as an example of a semiconductor device according to a first embodiment. The following figures are schematic, and for convenience of explanation, some configurational aspects may be omitted.

FIG. 1 is a schematic equivalent circuit diagram illustrating a configuration of the semiconductor storage device according to the first embodiment.

The semiconductor storage device according to the present embodiment includes a memory cell array MCA and a peripheral circuit PC that controls the memory cell array MCA.

The memory cell array MCA includes a plurality of memory blocks MB. Each of the plurality of memory blocks MB includes a plurality of sub-blocks SB. Each of the plurality of sub-blocks SB includes a plurality of memory strings MS. One ends of the plurality of memory strings MS are connected to the peripheral circuit PC through bit lines BL, respectively. Also, the other ends of the plurality of memory strings MS are connected to the peripheral circuit PC through a common source line SL, respectively.

Each memory string MS includes a drain select transistor STD, a plurality of memory cells MC, and a source select transistor STS connected in series between the bit line BL and the source line SL. Hereinafter, the drain select transistor STD and the source select transistor STS may be simply referred to as select transistors (STD and STS).

The memory cell MC is a field effect transistor in which an electric charge storage film is provided in a gate insulating film. A threshold voltage of the memory cell MC changes according to an amount of electric charge in the electric charge storage film. Word lines WL are connected to the gate electrodes of the plurality of memory cells MC corresponding to one memory string MS, respectively. These word lines WL are commonly connected to all the memory strings MS in one memory block MB.

The select transistors (STD and STS) are field effect transistors. Selection gate lines (SGD and SGS) are connected to the gate electrodes of the select transistors (STD and STS), respectively. The drain select line SGD is provided corresponding to the sub-block SB, and is commonly connected to all the memory strings MS in one sub-block SB. The source select line SGS is commonly connected to all memory strings MS in a plurality of the sub-blocks SB.

The peripheral circuit PC generates, for example, voltages necessary for a read operation, a write operation, and an erase operation, and applies the voltages to the bit line BL, the source line SL, the word line WL, and the select gate lines (SGD and SGS). The peripheral circuit PC includes, for example, a plurality of transistors and wirings provided on the same chip as the memory cell array MCA.

Figure 2:
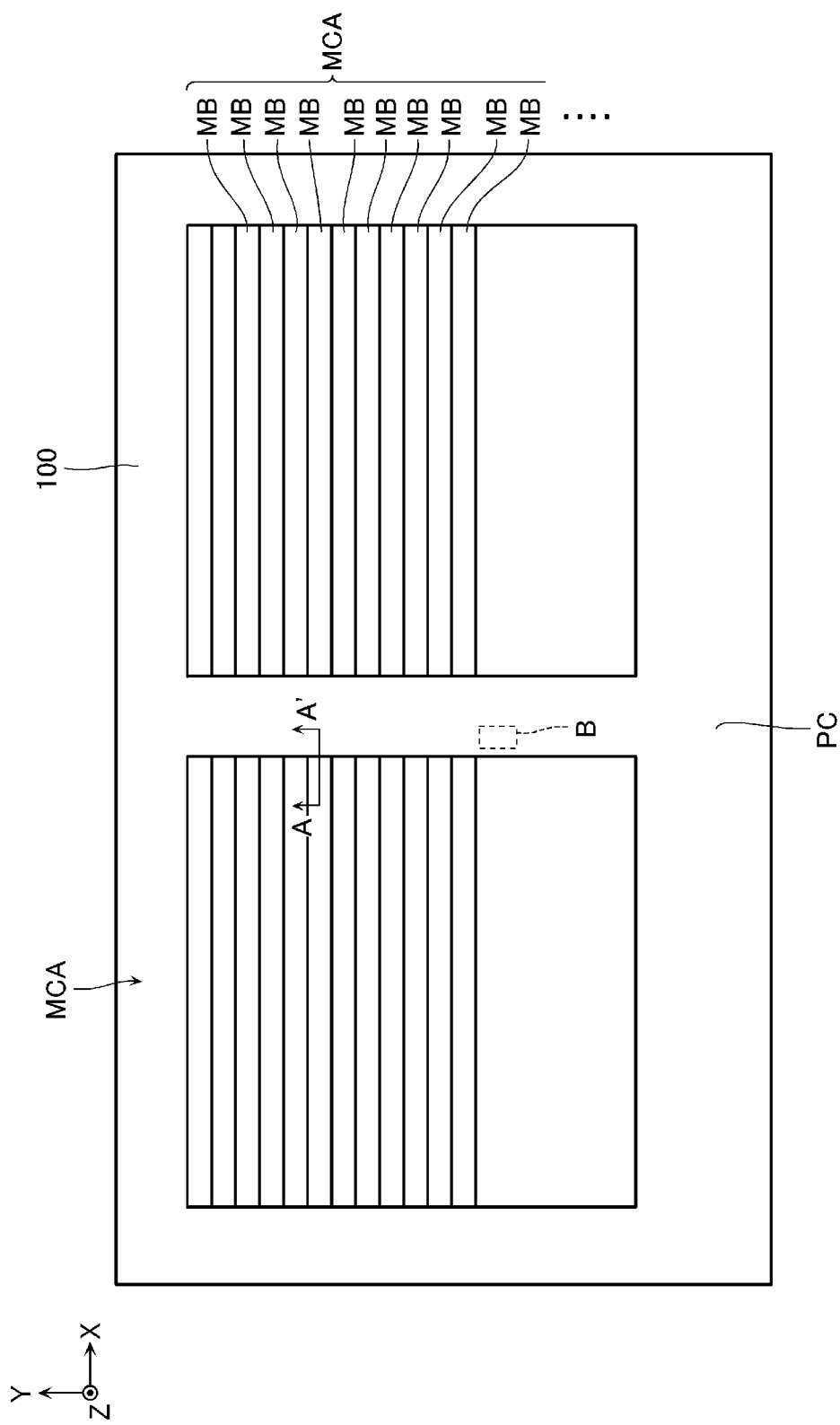
FIG. 2 illustrates a schematic plan view of the semiconductor storage device.

FIG. 2 illustrates a schematic plan view of a configuration example of the semiconductor storage device according to the present embodiment. As illustrated in FIG. 2, the semiconductor storage device according to the present embodiment includes a semiconductor substrate 100. In the illustrated example, the semiconductor substrate 100 has two memory cell arrays MCA arranged in the X-direction. The memory cell array MCA includes a plurality of memory blocks MB arranged in the Y-direction. In a region outside the region where the memory cell array MCA is provided, a plurality of transistors constituting the peripheral circuit PC (FIG. 1) are provided.

Figure 3:
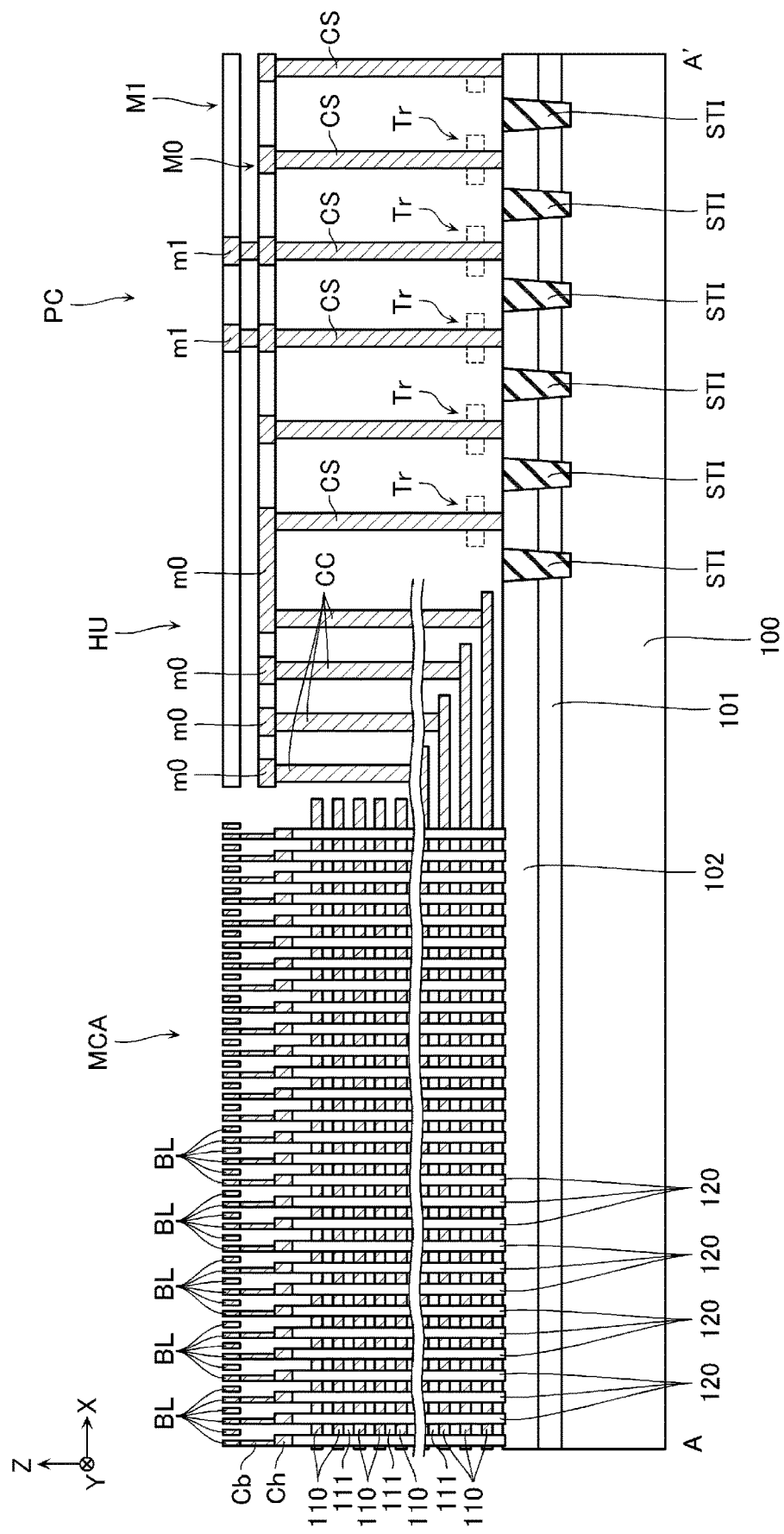
FIG. 3 illustrates a schematic cross-sectional view of a structure illustrated in FIG. 2 taken along the line A-A'.

FIG. 3 illustrates a schematic cross-sectional view of the structure illustrated in FIG. 2 taken along the line A-A' and viewed in the direction of an arrow. In FIG. 3, the memory cell array MCA, a hookup HU provided at the end portion of the memory cell array MCA in the X-direction, and a part of the peripheral circuit PC are illustrated. Wiring layers M0 and M1 are provided above these elements.

The memory cell array MCA includes a plurality of conductive layers 110 and a plurality of semiconductor layers 120 provided above the semiconductor substrate 100. Further, gate insulating films (not illustrated) are provided between the plurality of conductive layers 110 and the plurality of semiconductor layers 120, respectively.

The semiconductor substrate 100 is, for example, a semiconductor substrate of single crystal silicon (Si) or the like containing P-type impurities. An N-type well 101 containing N-type impurities such as phosphorus (P) is provided on a part of a surface of the semiconductor substrate 100. A P-type well 102 containing P-type impurities such as boron (B) is provided on a part of a surface of the N-type well 101. An insulating region STI such as $SiO_2$ is provided on a part of the surface of the semiconductor substrate 100.

Each conductive layer 110 is a substantially plate-like conductive layer extending in the X-direction, and a plurality of the conductive layers 110 are arranged in the Z-direction. The conductive layer 110 may include, for example, a stacked film of titanium nitride (TiN) and tungsten (W), or may contain polycrystalline silicon containing impurities such as phosphorus or boron. An insulating layer 111 such as silicon oxide ($SiO_2$) is provided between the conductive layers 110.

Among the plurality of conductive layers 110, one or more conductive layers 110 positioned in the lowermost layer function as the source selection line SGS (FIG. 1) and gate electrodes of the plurality of source select transistors STS connected thereto. The plurality of conductive layers 110 positioned above the lowermost conductive layer 110 functions as the word line WL (FIG. 1) and gate electrodes of the plurality of memory cells MC (FIG. 1) connected the word line WL. Further, one or more conductive layers 110 positioned above the conductive layer 110 function as the drain select line SGD and gate electrodes of a plurality of drain select transistors STD (FIG. 1) connected to the drain select line SGD.

The semiconductor layers 120 are, for example, semiconductor films of non-doped polycrystalline silicon (Si) or the like. The semiconductor layers 120 have, for example, a substantially columnar shape or substantially cylindrical shape extending in the Z-direction. The outer circumferential surfaces of the semiconductor layers 120 are surrounded by the conductive layer 110, respectively. A lower end portion of each semiconductor layer 120 is connected to, for example, the P-type well 102 of the semiconductor substrate 100. An upper end portion of each semiconductor layer 120 is connected to each bit line BL through a semiconductor layer containing N-type impurities such as phosphorus (P) and contacts Ch and Cb. The semiconductor layers 120 function as, for example, channel regions of the plurality of memory cells MC, the drain select transistor STD, and the source select transistor STS provided in one memory string MS (FIG. 1).

Further, as described above, gate insulating films (not illustrated) are provided between the plurality of conductive layers 110 and the plurality of semiconductor layers 120, respectively. The gate insulating film includes, for example, a tunnel insulating film such as silicon oxide ($SiO_2$), an electric charge storage film such as silicon nitride (SiN), and a block insulating film such as silicon oxide ($SiO_2$) stacked between the semiconductor layer 120 and the conductive layer 110. The gate insulating film may include, for example, a floating gate of polycrystalline silicon or the like containing N-type or P-type impurities.

The hookup HU includes end portions of the plurality of conductive layers 110 in the X-direction and the contacts CC connected thereto. Each contact CC has a substantially columnar shape extending in the Z-direction. The lower ends of the contacts CC are connected to the conductive layers 110. The upper ends of the contacts CC are provided above the upper ends of the semiconductor layers 120, and are connected to wirings m0 and m1 in the wiring layers M0 and M1.

The peripheral circuit PC includes a plurality of transistors Tr provided on the surface of the semiconductor substrate 100, and contacts CS connected to source regions, drain regions, and gate electrodes of the plurality of transistors Tr. Each contact CS has a substantially cylindrical shape extending in the Z-direction. The lower ends of the contacts CS are connected to the transistors Tr. The upper ends of the contacts CS are provided above the upper ends of the semiconductor layer 120, and are connected to the wirings m0 and m1.

The wiring layers M0 and M1 include metal wirings m0 and m1, respectively. The wirings m0 and m1 are formed by, for example, a damascene method or the like. The wiring m0 includes, for example, a stacked film of titanium nitride (TiN) and tungsten (W). The wiring m1 includes, for example, a stacked film of titanium nitride (TiN) and copper (Cu). In the illustrated example, the bit lines BL are a part of the plurality of wires m1. Further, although two wiring layers arranged in the Z-direction are illustrated in the illustrated example, it is possible to provide three or more wiring layers.

Figure 4:
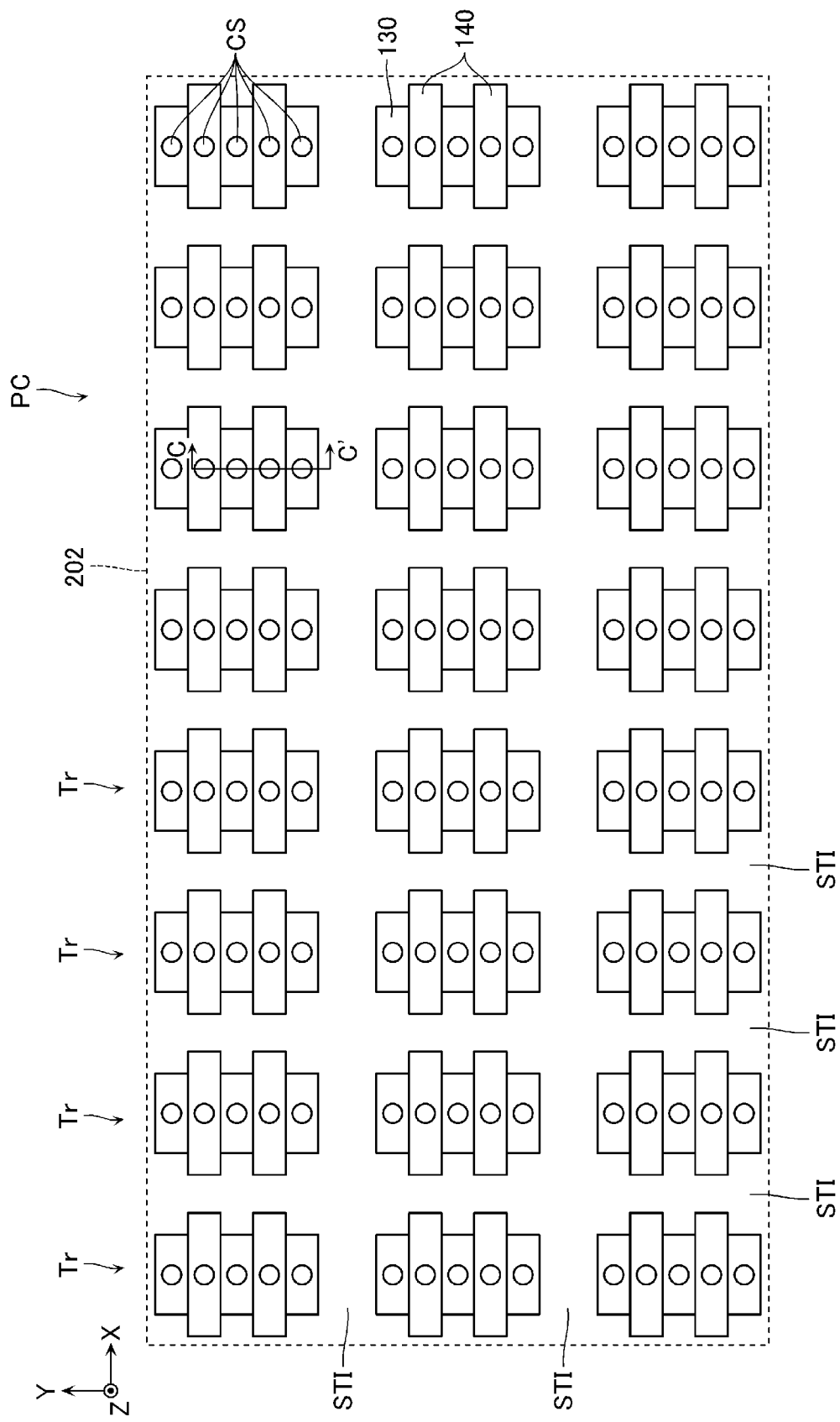
FIG. 4 illustrates a schematic enlarged view of a portion illustrated by B in FIG. 2.

FIG. 4 illustrates a schematic enlarged view of a portion indicated by B in FIG. 2. As illustrated in FIG. 4, the peripheral circuit PC includes the plurality of transistors Tr arranged in the X-direction and the Y-direction through insulating regions STI. Each of the transistors Tr includes a semiconductor portion 130 extending in the Y-direction, and gate electrode portions 140 extending in the X-direction and intersecting the semiconductor portion 130. The semiconductor portion 130 and the gate electrode portions 140 are connected to the contacts CS arranged in the Y-direction.

Figure 5:
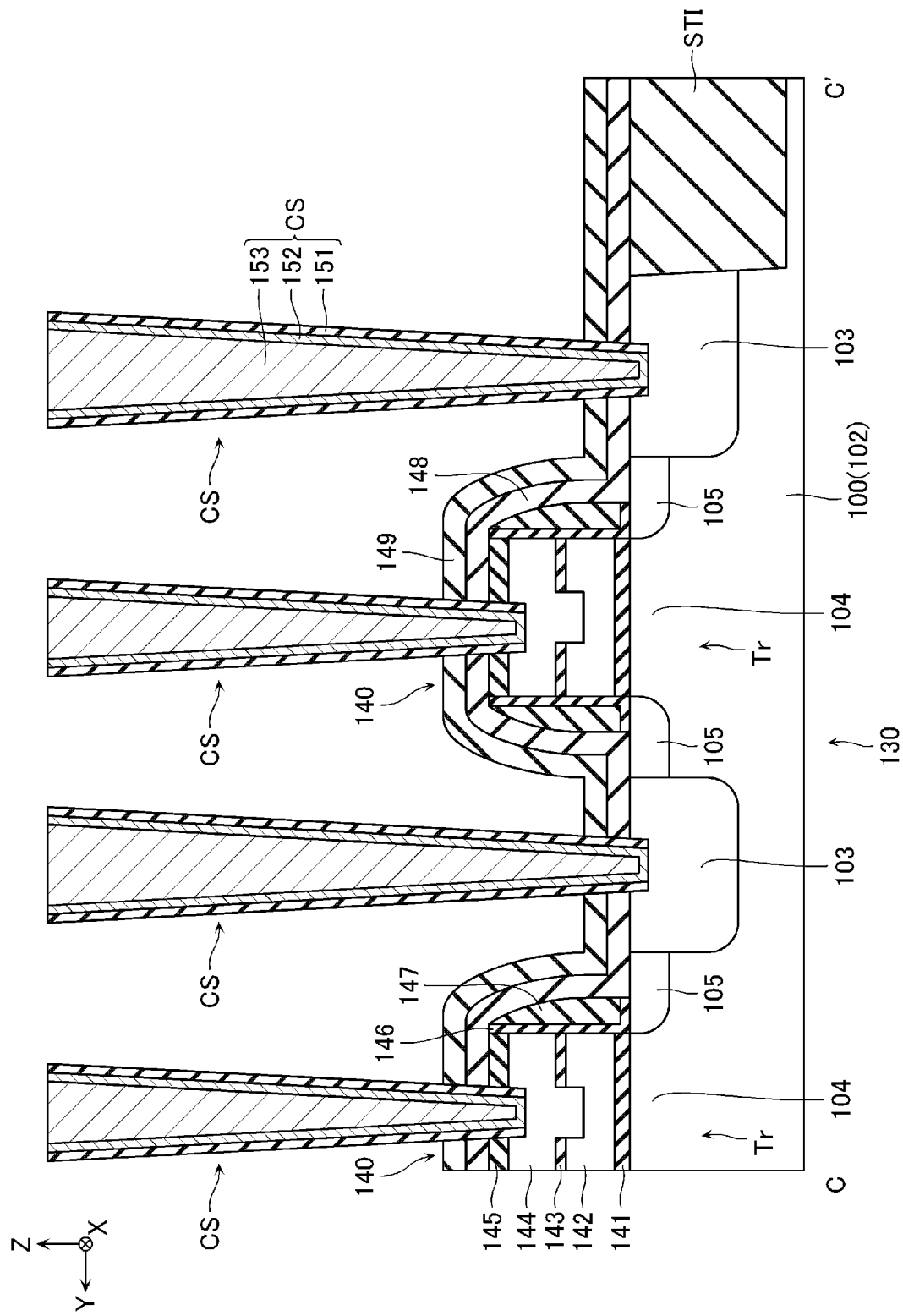
FIG. 5 illustrates a schematic cross-sectional view of a structure illustrated in FIG. 4 taken along the line C-C'.

FIG. 5 illustrates a schematic cross-sectional view of the structure illustrated in FIG. 4 taken along the line C-C' and viewed in the direction of an arrow.

The semiconductor portion 130 of the transistor Tr is provided in the P-type well 102 of the semiconductor substrate 100. The semiconductor portion 130 includes an N-type semiconductor region 103 connected to the contact CS, a P-type semiconductor region 104 provided between two N-type semiconductor regions 103 adjacent in the Y-direction, an N-type semiconductor region 105 provided between the N-type semiconductor region 103 and the P-type semiconductor region 104. Impurity concentration of the N-type impurities in the N-type semiconductor region 103 is greater than the impurity concentration of the N-type impurities in the N-type semiconductor region 105.

Each gate electrode portion 140 of the transistor Tr includes an insulating layer 141, a conductive layer 142, an insulating layer 143, a conductive layer 144, and an insulating layer 145 stacked on the surface of the P-type semiconductor region 104 of the semiconductor substrate 100. The conductive layer 144 is connected to the conductive layer 142. Each gate electrode portion 140 includes an insulating layer 146 and an insulating layer 147 stacked on the side surfaces of the insulating layers and conductive layers. In addition, an insulating layer 148 and an insulating layer 149 are provided on the upper surfaces and side surfaces of these structures, and on the surface of the semiconductor substrate 100. The insulating layers 141, 143, 147, and 148 contain, for example, silicon oxide ($SiO_2$). The conductive layers 142 and 144 contain, for example, polycrystalline silicon containing N-type or P-type impurities. The insulating layers 145, 146, and 149 contain, for example, silicon nitride ($Si_3N_4$) or the like. The contact CS is connected to the conductive layer 144.

Each contact CS includes, for example, a conductive layer 153 of tungsten (W) or the like extending in the Z-direction, a barrier conductive layer 152 of titanium nitride (TiN) or the like covering the outer circumferential surface and the lower surface of the conductive layer 153, and a protective layer 151 covering the outer circumferential surface of a barrier conductive layer 152. The lower surface of the barrier conductive layer 152 is connected to the N-type semiconductor region 103 of the semiconductor substrate 100.

Wiring Capacitance Between Contacts

As described with reference to FIG. 3, the semiconductor storage device according to the present embodiment includes the plurality of conductive layers 110 and the plurality of semiconductor layers 120 provided above the semiconductor substrate 100. The semiconductor storage device according to the present embodiment also includes contacts CC and CS extending in the Z-direction.

With high integration of the semiconductor storage device, the number of conductive layers 110 stacked in the Z-direction tends to increase, and the length of the semiconductor layer 120 in the Z-direction also tends to increase. Along with this, the length of the contacts CC and CS in the Z direction also tends to increase. From the viewpoint of reducing a circuit area, it is desirable to decrease the transistor Tr and the like in the X-direction and the Y-direction (see FIG. 4). Along with this, the distances between the contacts CC and between the contacts CS in the X-direction and the Y-direction tend to decrease. As a result, a wiring capacitance between the contacts CC and between the contacts CS tends to increase. Such an increase in wiring capacitance is not preferable from the viewpoint of speeding up the read operation, write operation, and erase operation of the semiconductor storage device.

Figure 6:
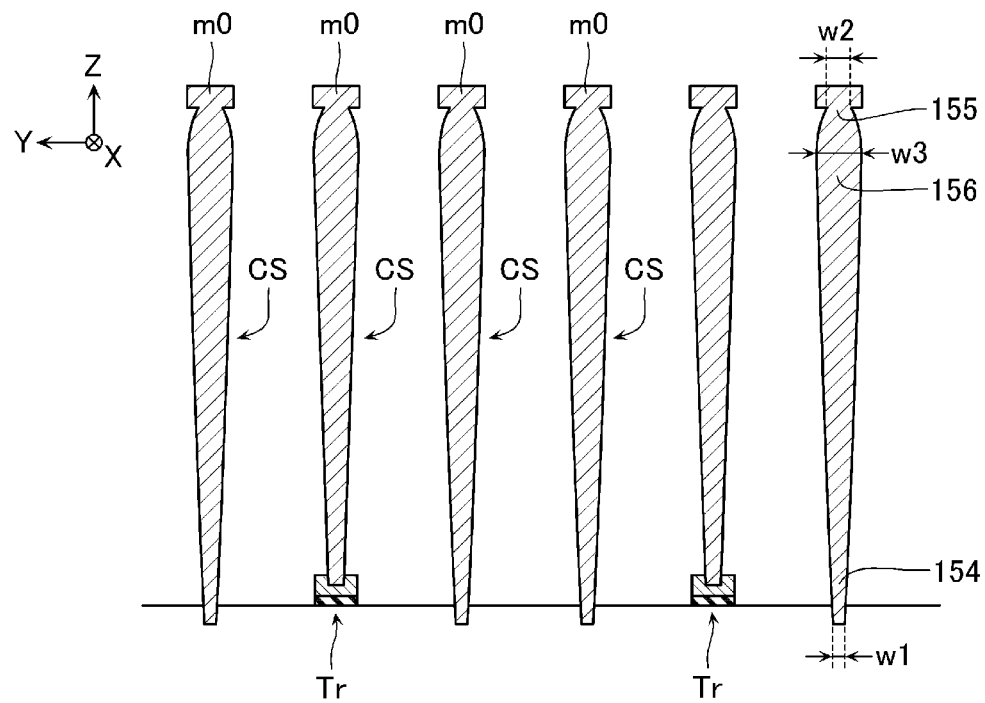
FIG. 6 illustrates a schematic cross-sectional view illustrating contacts.
Figure 7:
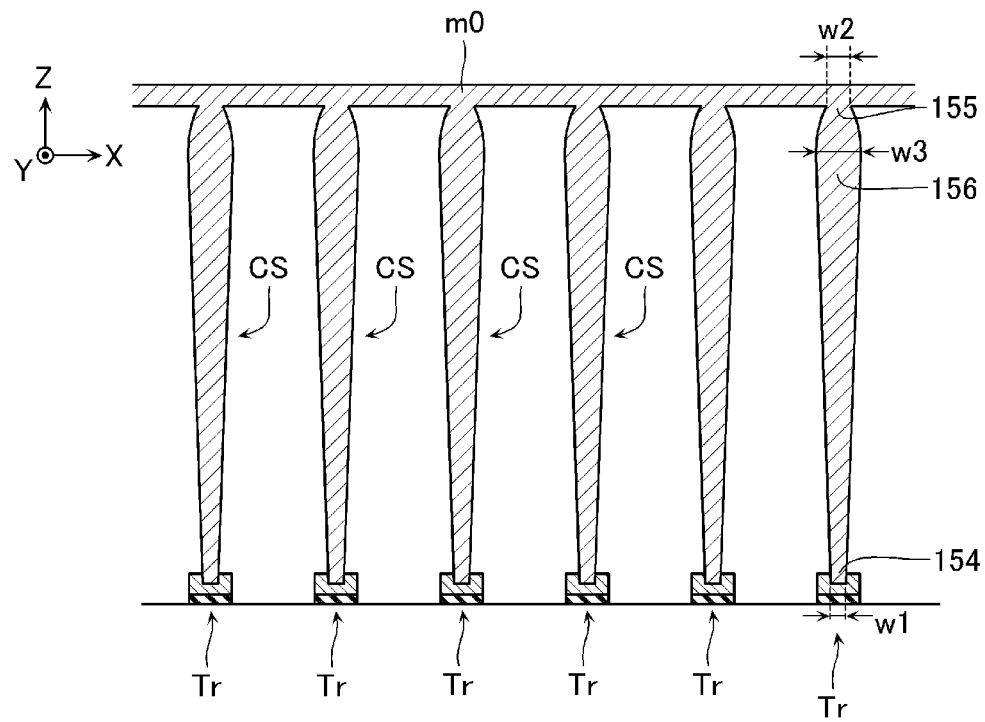
FIG. 7 illustrates a schematic cross-sectional view illustrating contacts.

Here, when creating a contact having a high aspect shape like the contacts CC and CS, for example, as illustrated in FIGS. 6 and 7, a width w1 of a lower end portion 154 in the X-direction and the Y-direction and a width w2 of an upper end portion 155 in the X-direction and the Y-direction may be smaller than a width w3 of bowing portions 156 each of which is located between the upper and lower end portions. Hereinafter, a portion where at least one of the width w3 in the X-direction and the width w3 in the Y-direction of the contacts CC, CS, the semiconductor layer 120, and the like is maximum or maximum may be referred to as a "bowing portion". In FIGS. 6 and 7, illustrate the bowing portions 156.

For example, when focusing on two contacts CS adjacent in the X-direction or Y-direction, these two contacts CS may be closest to each other in the bowing portions 156. In such a case, by, it is considered that the wiring capacitance between the contacts CC and between the contacts CS can be suitably reduced by reducing capacitance between the bowing portions 156.

Configuration Example of Peripheral Circuit PC

Figure 8:
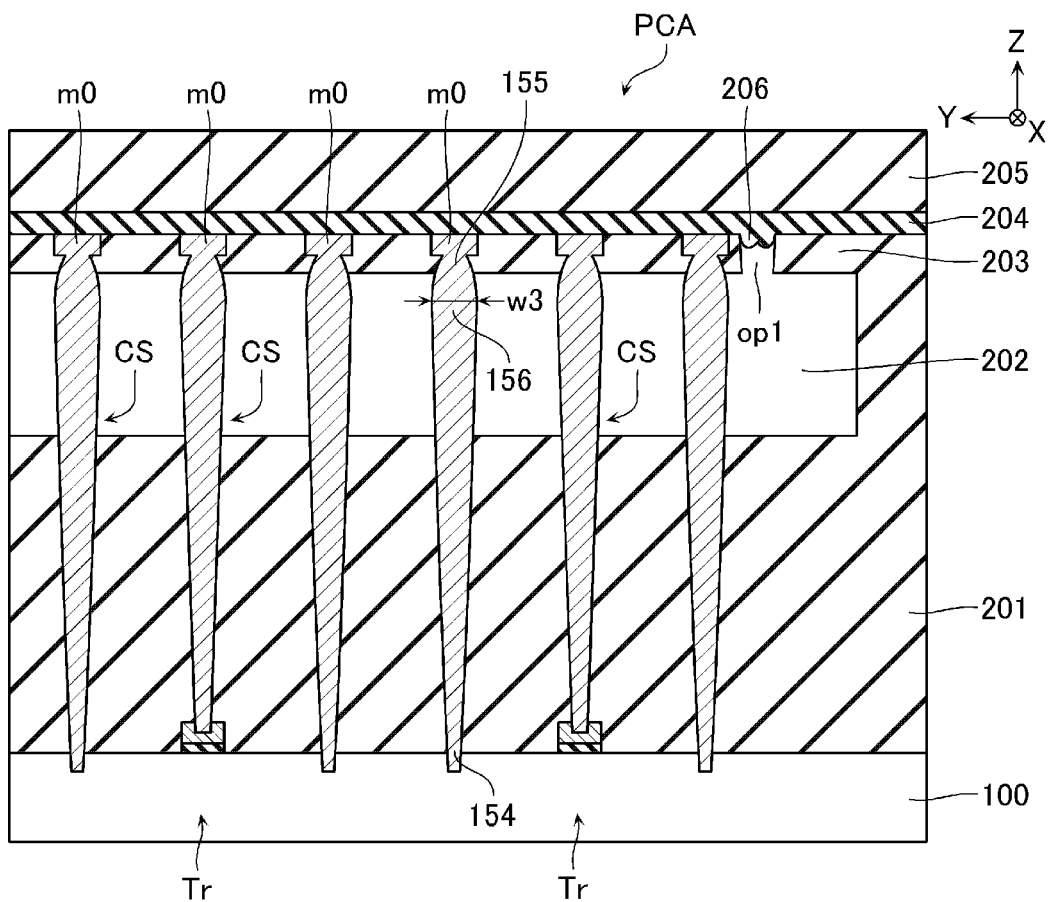
FIG. 8 illustrates a schematic cross-sectional view of a peripheral circuit according to a first embodiment.

FIG. 8 illustrates a schematic cross-sectional view of a peripheral circuit PCA as a configuration example of the peripheral circuit PC according to the present embodiment. The peripheral circuit PCA according to the present embodiment includes an insulating layer 201 of silicon oxide ($SiO_2$) or the like, a void layer 202, and an insulating layer 203 of silicon oxide ($SiO_2$) or the like provided in order on the semiconductor substrate 100. The peripheral circuit PCA includes a plurality of contacts CS extending in the Z direction by penetrating through the insulating layer 203, the void layer 202, and the insulating layer 201 and arranged in the X-direction and the Y-direction, and wirings m0 provided at the upper end of the contacts CS. The peripheral circuit PCA includes an insulating layer 204 of silicon oxide ($SiO_2$) or the like and an insulating layer 205 silicon oxide ($SiO_2$) or the like provided in order on the upper surface of the insulating layer 203 and the wiring m0.

The void layer 202 is surrounded by the upper surface of the insulating layer 201, the bottom surface of the insulating layer 203, and the side surface of the insulating layer 203. A film thickness of the insulating layer 203 in the Z-direction is relatively small in a region where the void layer 202 is provided and relatively large in a region where the void layer 202 is not provided.

In the example of FIG. 8, the bowing portions 156 of the plurality of contacts CS are all provided in the void layer 202. The width of the void layer 202 in the Z-direction is greater than the sum of the widths of at least one conductive layer 110 (FIG. 3) and one insulating layer 111 (FIG. 3) adjacent to the conductive layer 110 in the Z-direction.

As illustrated in FIG. 4, the void layer 202 according to the present embodiment is provided in a region in which a plurality of transistors Tr are arranged in the X-direction and the Y-direction. Accordingly, the void layer 202 includes a part of the plurality of contacts CS connected to the plurality of transistors Tr.

In the example of FIG. 8, the insulating layer 203 has an opening op1 penetrating through the insulating layer 203 and extending in the Z-direction. The insulating layer 204 has a closing portion 206 protruding downward. The closing portion 206 contacts the inner circumferential surface of the opening op1 to close the opening op1. The lower end of the closing portion 206 is exposed to the void layer 202 or the opening op1. Although one opening op1 and one closing portion 206 are illustrated in FIG. 8, it is also possible to provide a plurality of openings op1 and closing portions 206.

Manufacturing Method

Next, with reference to FIGS. 9 to 17, a method of manufacturing the semiconductor storage device according to the present embodiment will be illustrated. FIGS. 9 to 17 illustrate schematic cross-sectional views of a structure to illustrate process steps of the manufacturing method in this order.

Figure 9:
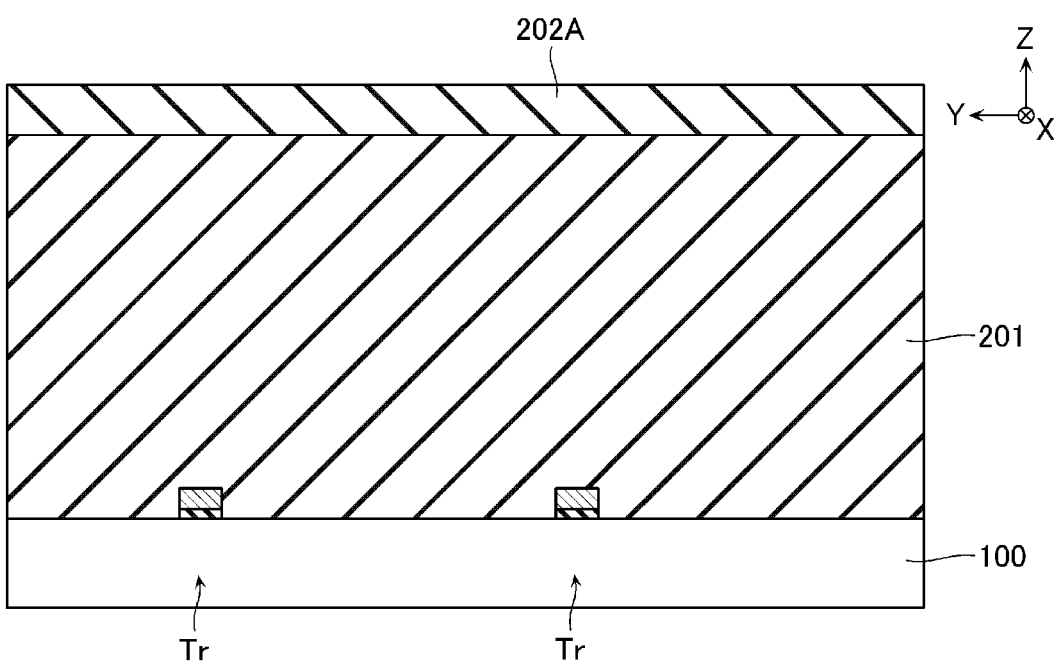
FIGS. 9-17 illustrate aspects of a manufacturing method of a peripheral circuit according to a first embodiment.

In the manufacturing method, for example, as illustrated in FIG. 9, the transistors Tr are formed on the semiconductor substrate 100. Next, the insulating layer 201 is formed on the semiconductor substrate 100 by means such as chemical vapor deposition (CVD) using gas such as tetraethyl orthosilicate (TEOS). Next, a sacrificial layer 202A of silicon nitride ($Si_3N_4$) or the like is formed on the upper surface of the insulating layer 201 by means of CVD or the like.

Figure 10:
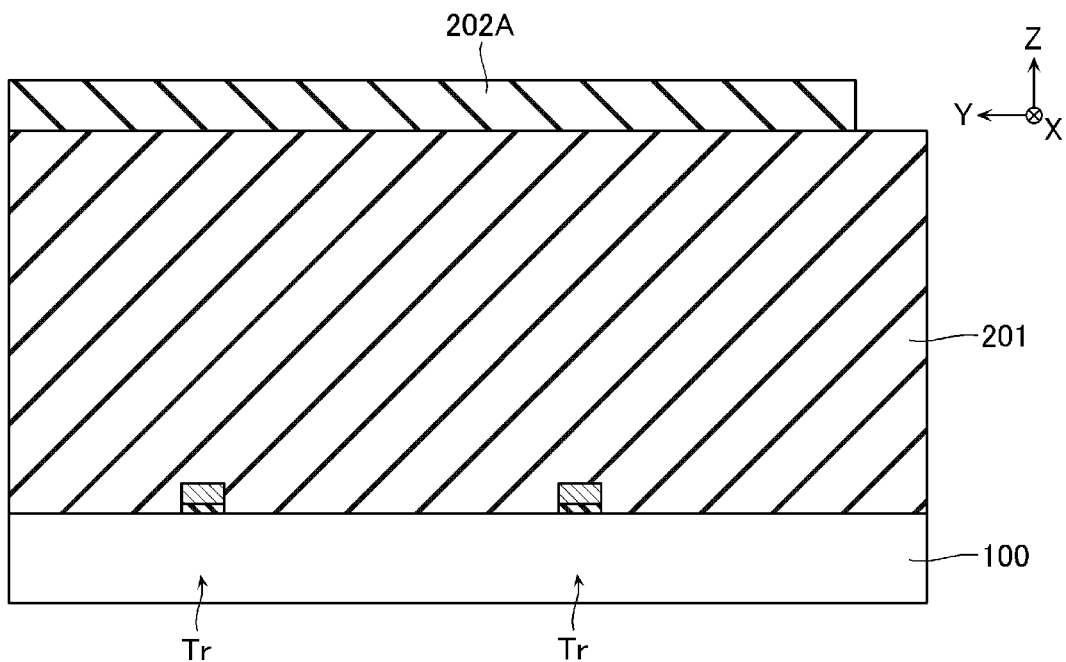

Next, as illustrated in FIG. 10, for example, a part of the sacrificial layer 202A is removed by means such as reactive ion etching (RIE). The sacrificial layer 202A remains, for example, in a region where the void layer 202 is provided (see FIG. 4).

Figure 11:
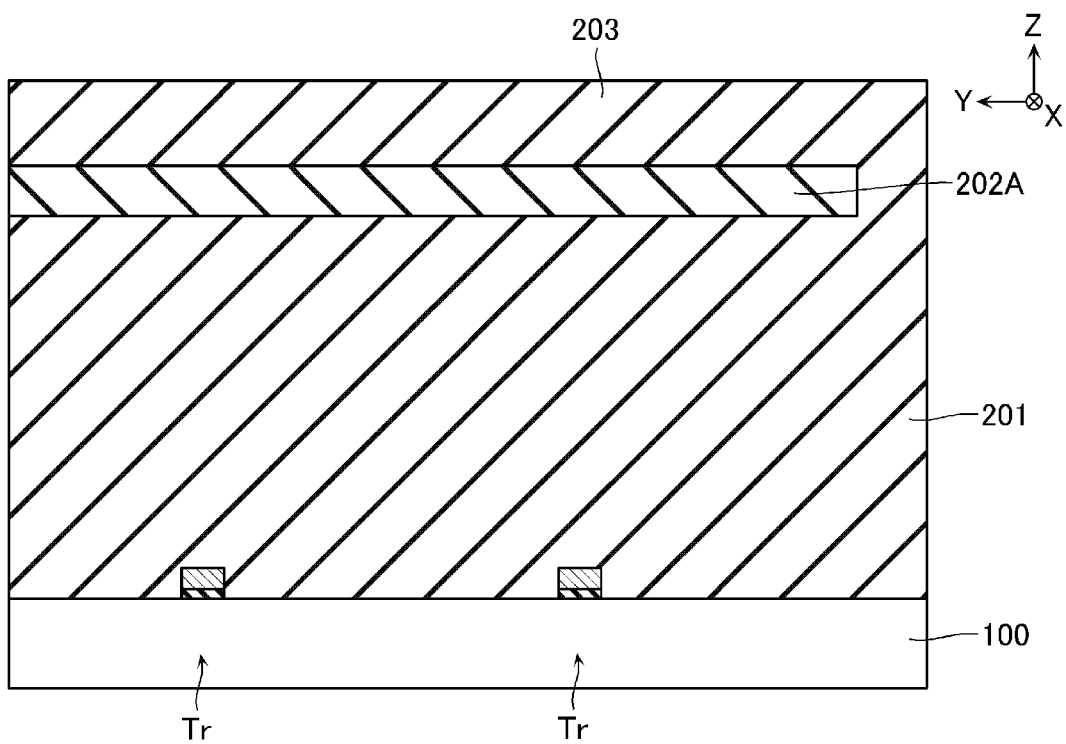

Next, as illustrated in FIG. 11, for example, the insulating layer 203 is formed on the upper surface of the insulating layer 201 and on the upper surface and the side surface of the sacrificial layer 202A by means such as CVD using gas such as TEOS. Next, the upper surface of the insulating layer 203 may be planarized by, for example, means such as RIE.

Figure 12:
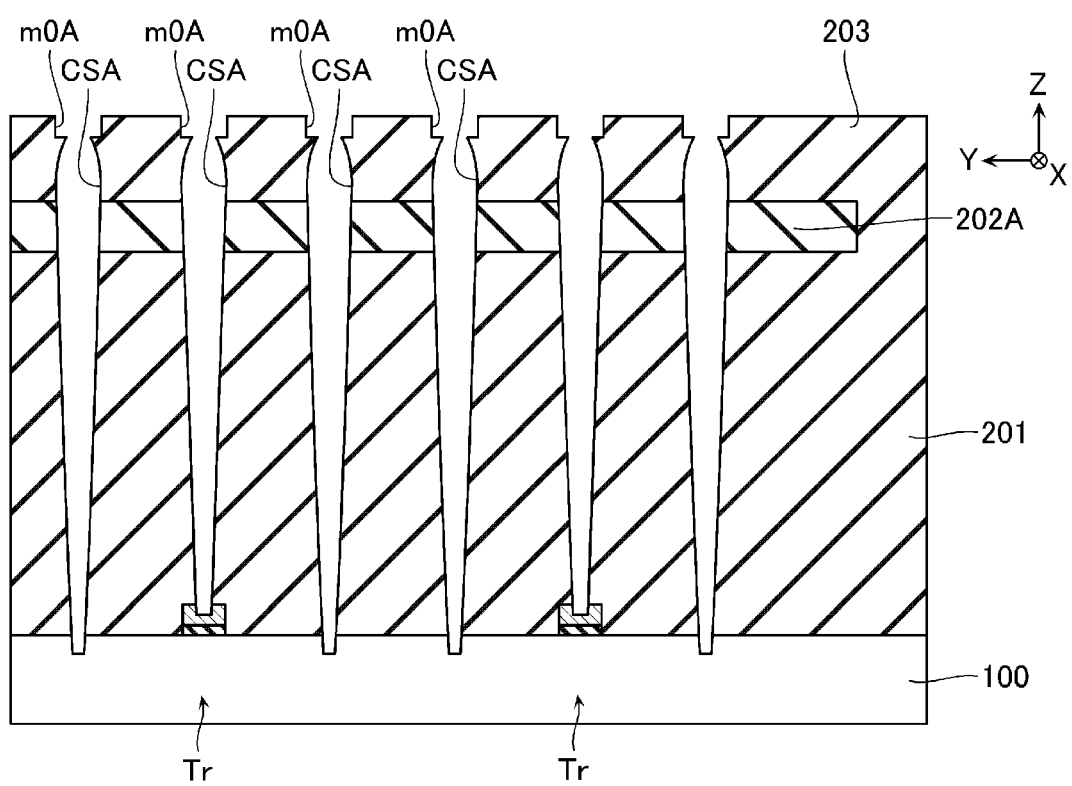

Next, as illustrated in FIG. 12, for example, contact holes CSA penetrating through the insulating layer 203, the sacrificial layer 202A, and the insulating layer 201 and extending in the Z-direction are formed by means such as RIE. Further, for example, grooves m0A connected to the contact holes CSA are formed by means such as RIE.

Figure 13:
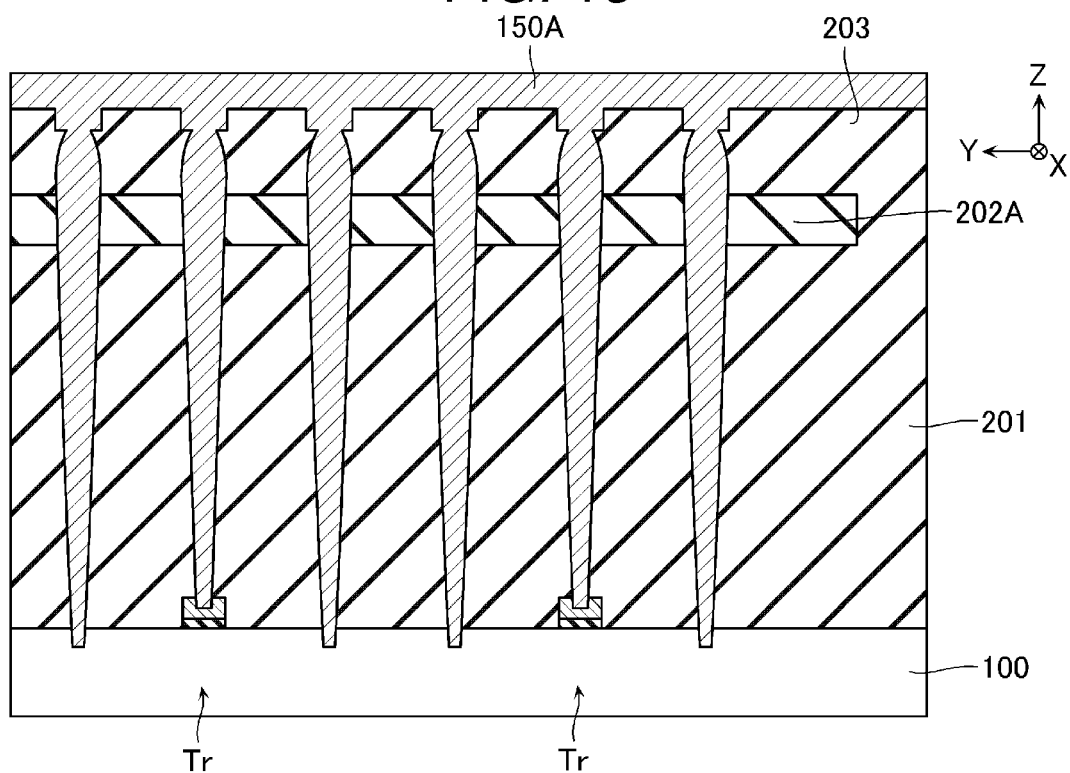

Next, for example, as illustrated in FIG. 13, a conductive layer 150A is formed. For example, the protective layer 151 (FIG. 5) is formed on the contact holes CSA and the grooves m0A by means such as CVD. Next, the protective layer 151 provided on the bottom of the contact hole CSA is removed by means such as RIE. Next, the barrier conductive layer 152 (FIG. 5) and the conductive layer 153 (FIG. 5) are formed in the contact hole CSA and the groove m0A by means of, for example, CVD.

Figure 14:
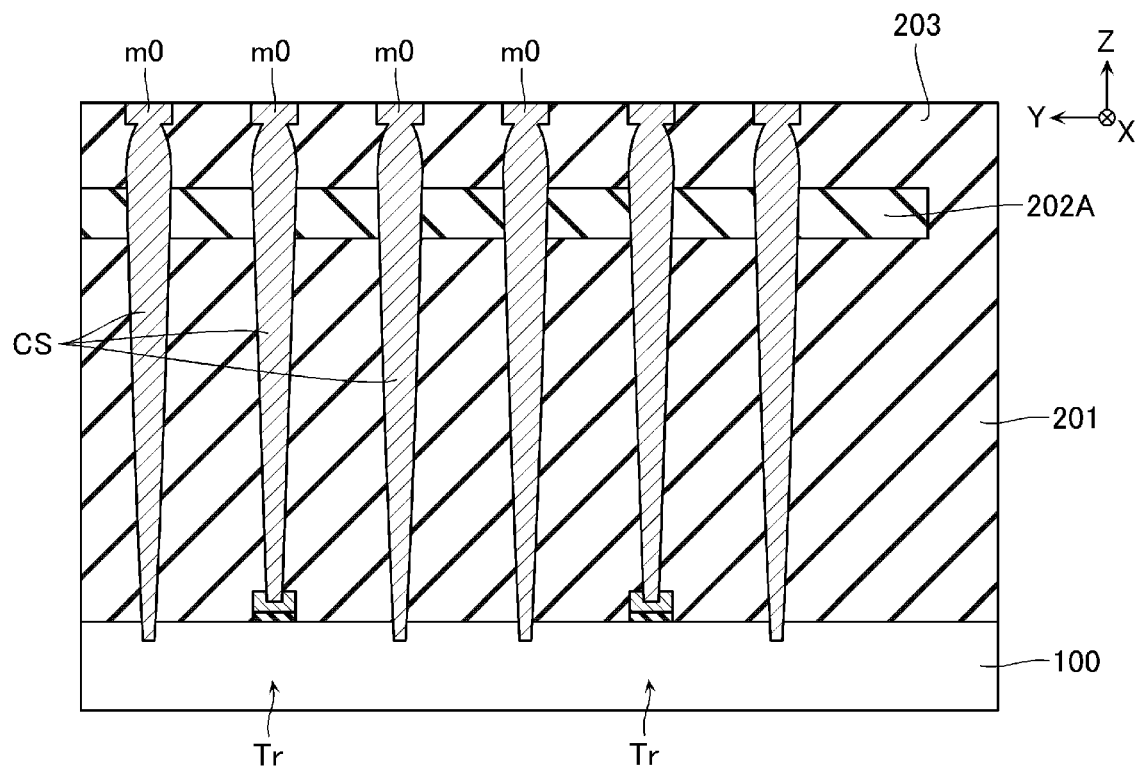

Next, as illustrated in FIG. 14, for example, a part of the conductive layer 150A is removed by means of, for example, chemical mechanical polishing (CMP) to form the contacts CS and the wirings m0.

Figure 15:
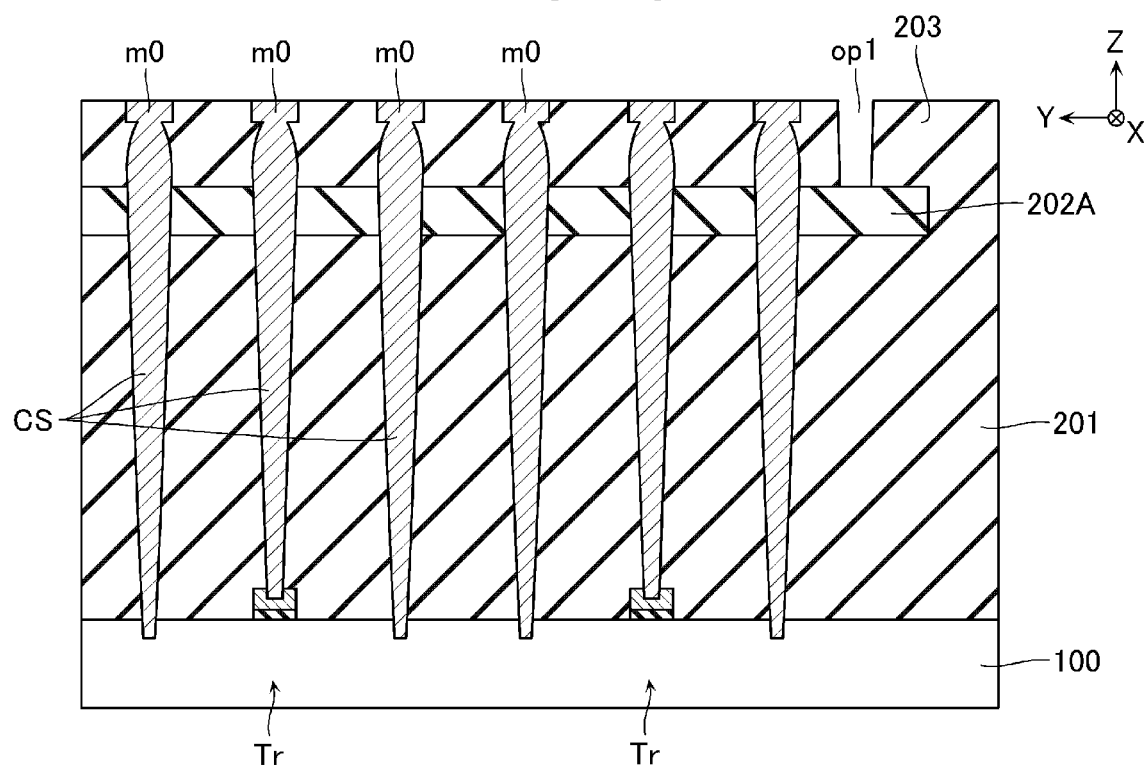

Next, as illustrated in, for example, FIG. 15, the opening op1 penetrating through a part of the insulating layer 203 and exposing the sacrificial layer 202A is formed by means such as RIE.

Figure 16:
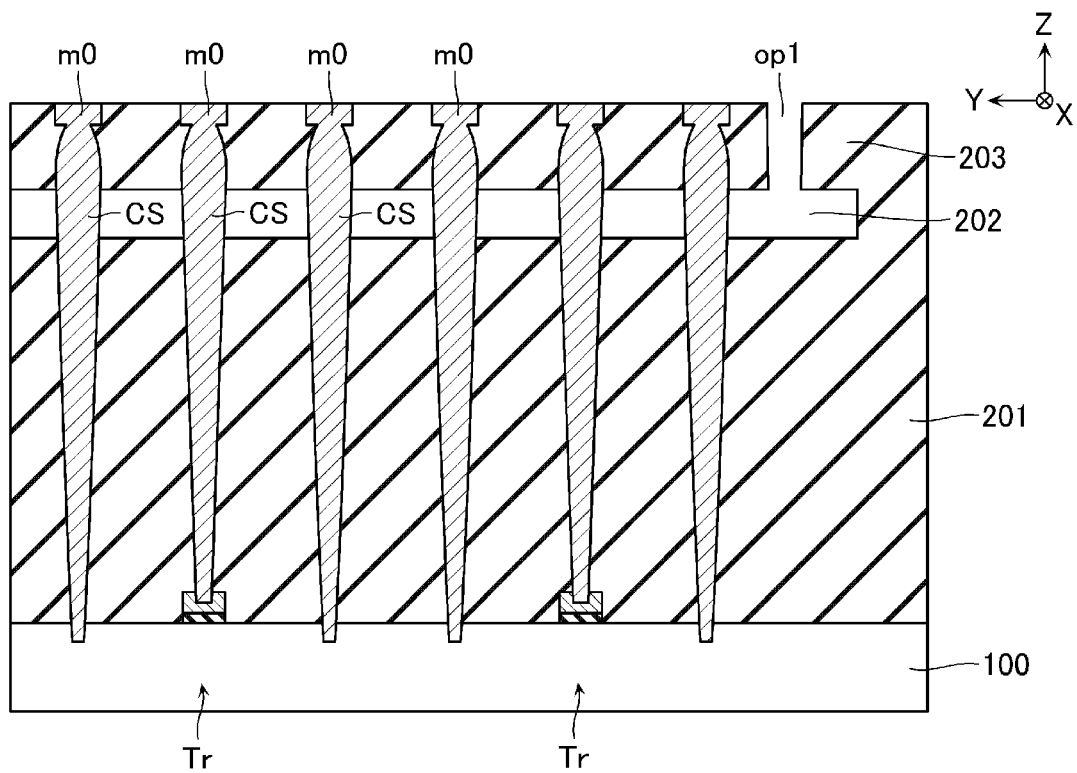

Next, for example, as illustrated in FIG. 16, the sacrificial layer 202A is removed, for example, by means such as wet etching or the like through the opening op1, to form the void layer 202.

Figure 17:
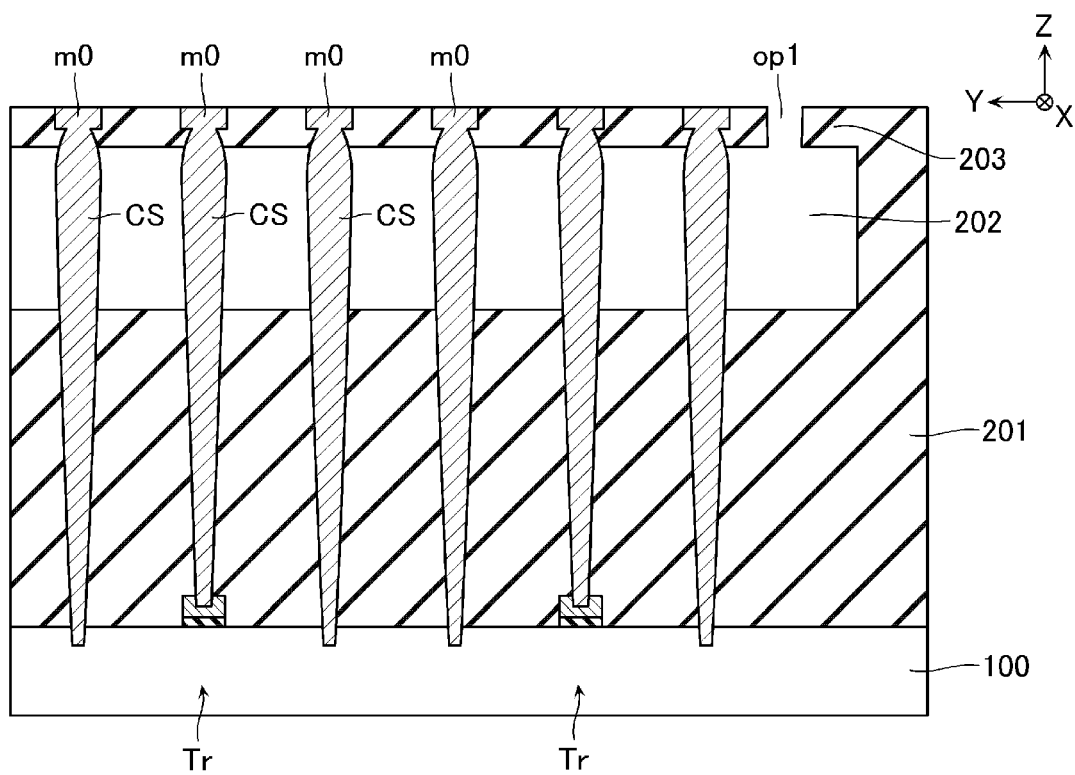

Next, for example, as illustrated in FIG. 17, a part of the insulating layer 201 and the insulating layer 203 is removed, for example, by means such as wet etching through the opening op1, to expand the void layer 202.

Thereafter, for example, as illustrated in FIG. 8, the insulating layer 204 of silicon oxide ($SiO_2$) or the like is formed by means such as plasma CVD using gas such as silane ($SiH_4$). The opening op1 is closed by the insulating layer, and the void layer 202 is separated from the external space. Next, the insulating layer 205 of silicon oxide ($SiO_2$) or the like is formed by means such as CVD using gas such as TEOS, for example.

Effects

As described with reference to FIG. 8, in the peripheral circuit PCA according to the present embodiment, the bowing portions 156 of the plurality of contacts CS are all provided in the void layer 202. With such a structure, the capacitance between the bowing portions 156 of the plurality of contacts CS can be suitably reduced. Easy miniaturization is possible, for example, as compared to a method of forming a slit between contacts CS and forming a void in this slit portion. Accordingly, according to such a structure, it is possible to simultaneously achieve high integration and high speed of the semiconductor storage device.

As described with reference to FIG. 4, in the peripheral circuit PCA according to the present embodiment, the void layer 202 includes a part of the plurality of contacts CS connected to the plurality of transistors Tr arranged in the X-direction and the Y-direction. Since the contacts CS are provided at a relatively high density, the capacitance between the contacts CS can be suitably reduced by providing the void layer 202 in such a region. Further, the insulating layer 201 and the insulating layer 203 can be supported by the plurality of contacts CS provided at relatively high density, and mechanical strength can be ensured.

As described with reference to FIG. 17, in the manufacturing method according to the present embodiment, the insulating layer 201 and the insulating layer 203 are partially removed by means such as wet etching through the opening op1 to expand the void layer 202. According to such a method, the width of the void layer 202 in the Z-direction can be suitably adjusted. With this configuration, the bowing portion 156 of the contact CS can be easily provided in a void layer 303.

As a result of being manufactured by such a method, the peripheral circuit PCA according to the present embodiment includes the opening op1 provided in the insulating layer 203 as described with reference to FIG. 8. The insulating layer 204 provided on the upper surface of the insulating layer 203 includes the closing portion 206 protruding downward.

Second Embodiment

Configuration

Next, with reference to FIGS. 18 and 19, a semiconductor storage device according to a second embodiment will be described. In the following description, the same parts as those in the first embodiment are denoted by the same reference numerals, and the description thereof will be omitted.

Figure 18:
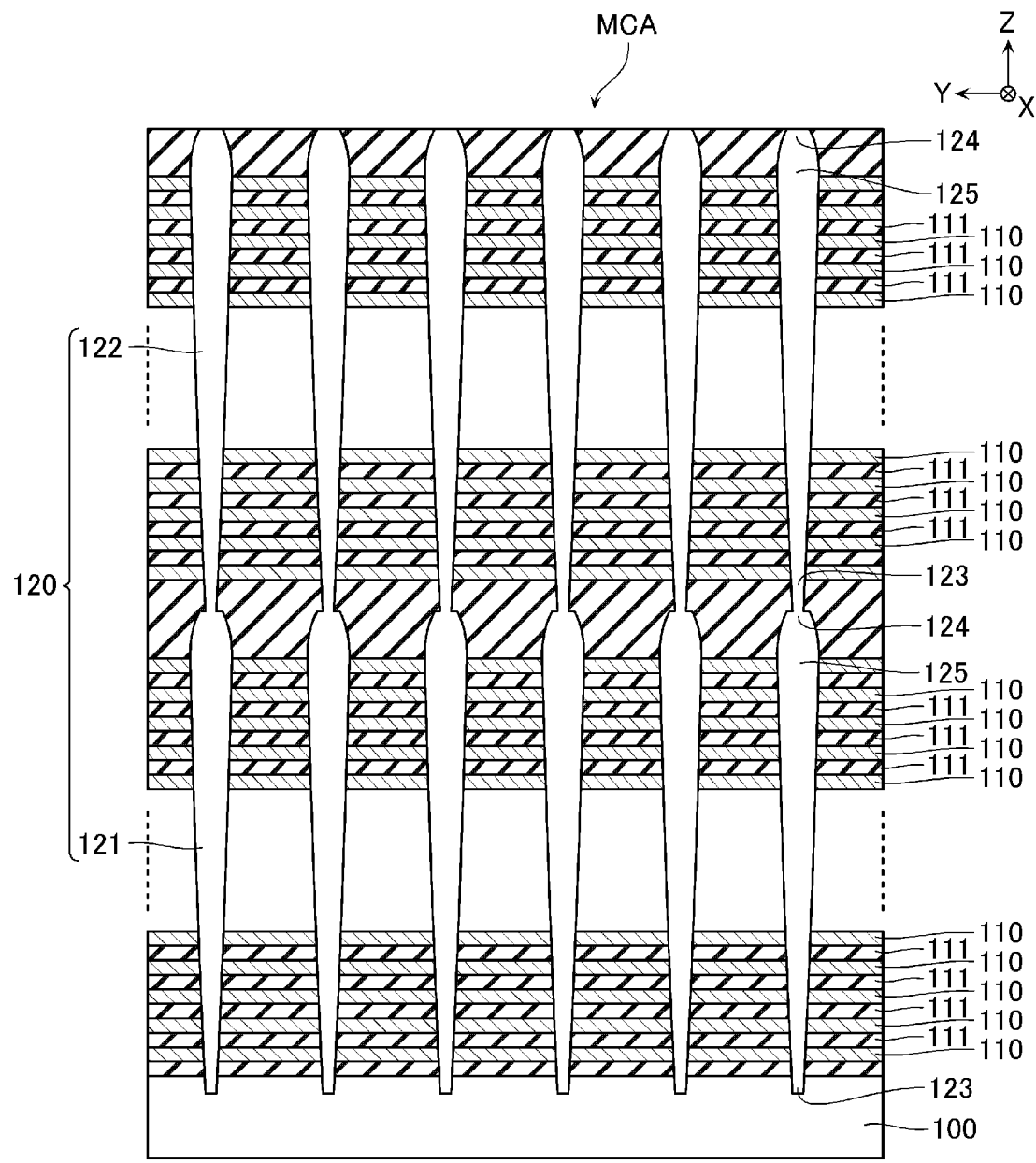
FIG. 18 illustrates a schematic cross-sectional view of a memory cell array according to a second embodiment.

FIG. 18 illustrates a schematic cross-sectional view of a part of the memory cell array MCA according to the present embodiment. As described above, the length of the semiconductor layer 120 in the Z-direction tends to increase with the high integration of the semiconductor storage device.

Along with this, formation of a memory hole in which the semiconductor layer 120 is formed may be performed a plurality of times.

The semiconductor layer 120 according to the present embodiment includes, for example, a semiconductor portion 121 extending in the Z-direction, and a semiconductor portion 122 connected to the upper end of the semiconductor portion 121 and extending in the Z-direction. The semiconductor portion 121 and the semiconductor portion 122 each include a lower end portion 123, an upper end portion 124, and a bowing portion 125 provided between the lower end portion 123 and the upper end portion 124.

Figure 19:
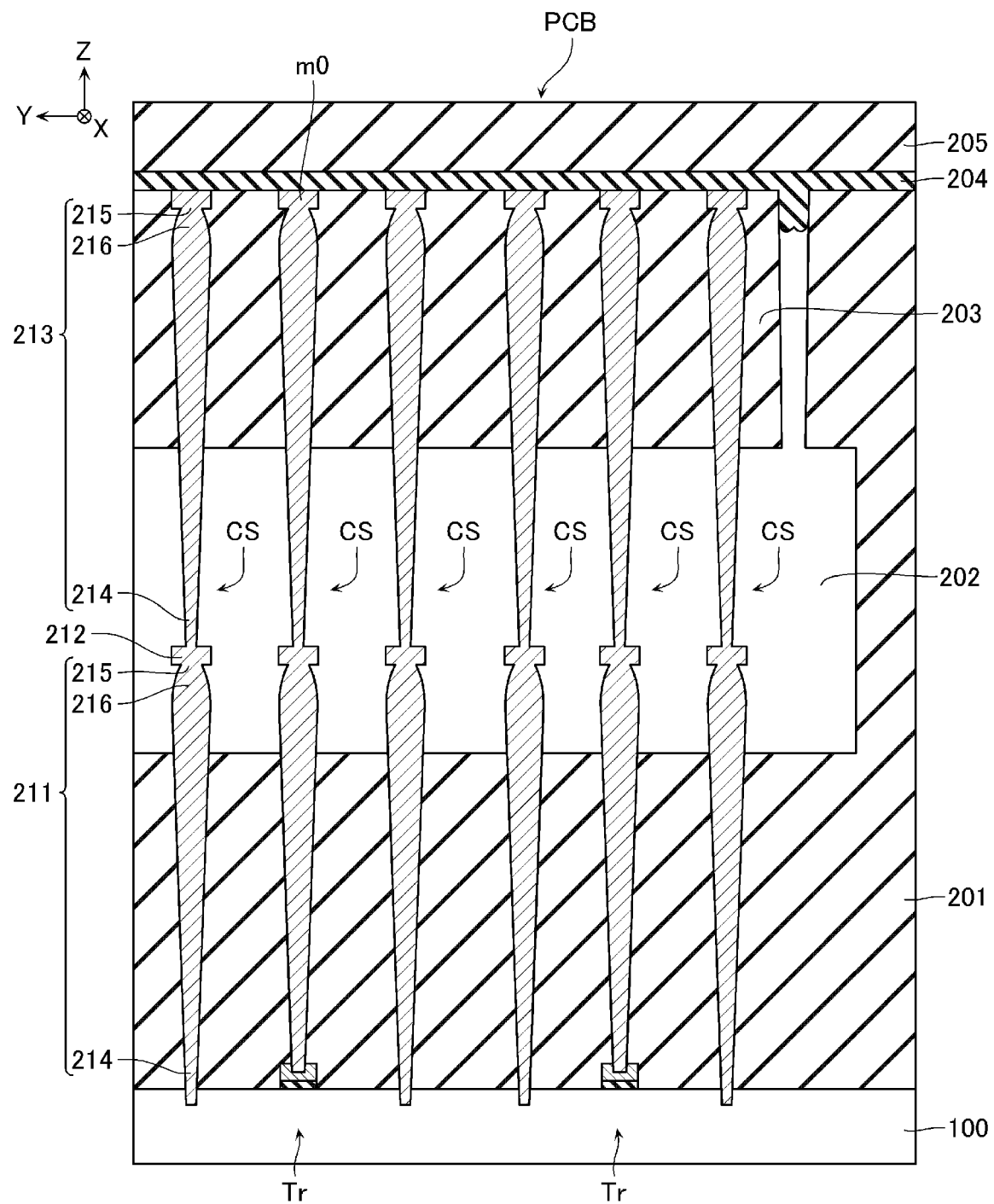
FIG. 19 illustrates a schematic cross-sectional view of a peripheral circuit according to a second embodiment.

FIG. 19 illustrates a schematic cross-sectional view of a part of a peripheral circuit PCB according to the present embodiment. When formation of the memory hole is performed a plurality of times, for example, it is conceivable that formation of the contact hole in which the contacts CC and CS are formed is also performed a plurality of times.

The contacts CC and CS according to the present embodiment each includes, for example, a contact portion 211 extending in the Z-direction, a connection portion 212 connected to the upper end of the contact portion 211, and a contact portion 213 connected to the upper surface of the connection portion 212 and extending in the Z-direction. The width in the Z-direction from the upper surface of the semiconductor substrate 100 to the upper surface of the connection portion 212 may be, for example, the same or substantially the as the width from in the Z-direction the upper surface of the semiconductor substrate 100 to the upper end of the semiconductor portion 121 (FIG. 18) of the semiconductor layer 120.

Each of the contact portion 211 and the contact portion 213 includes a lower end portion 214, an upper end portion 215, and a bowing portion 216 provided between the lower end portion 214 and the upper end portion 215. The width of the connection portion 212 in the X-direction and the Y-direction is larger than the width of the lower end portion 214 and the upper end portion 215 of the contact portion 211 and the contact portion 213 in the X-direction and the Y-direction. The width of the connection portion 212 in the X-direction and the Y-direction may be larger or smaller than the width of the bowing portion 216 of the contact portion 211 and the contact portion 213 in the X-direction and the Y-direction.

In the example of FIG. 19, the bowing portions 216 and the connection portions 212 of the plurality of contact portions 211 are all provided in the void layer 202. The width in the Z-direction from the upper surface of the connection portion 212 to the upper surface of the void layer 202 may be larger than the width in the Z-direction from the upper surface of the connection portion 212 to the bottom surface of the void layer 202, for example.

Manufacturing Method

Next, with reference to FIGS. 20 to 29, a method of manufacturing a semiconductor storage device according to the present embodiment will be illustrated. FIGS. 20 to 29 illustrate schematic cross-sectional views of a structure to illustrate process steps of the manufacturing method in this order.

Figure 20:
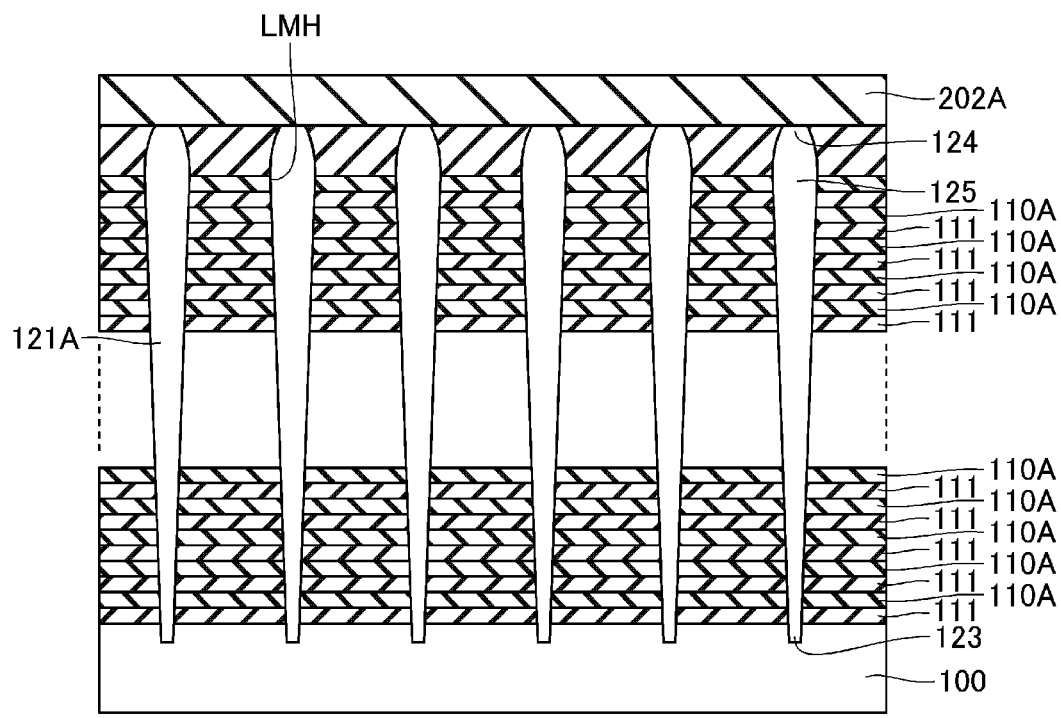
FIGS. 20-29 illustrate aspects of a manufacturing method of a peripheral circuit according to a second embodiment.
Figure 21:
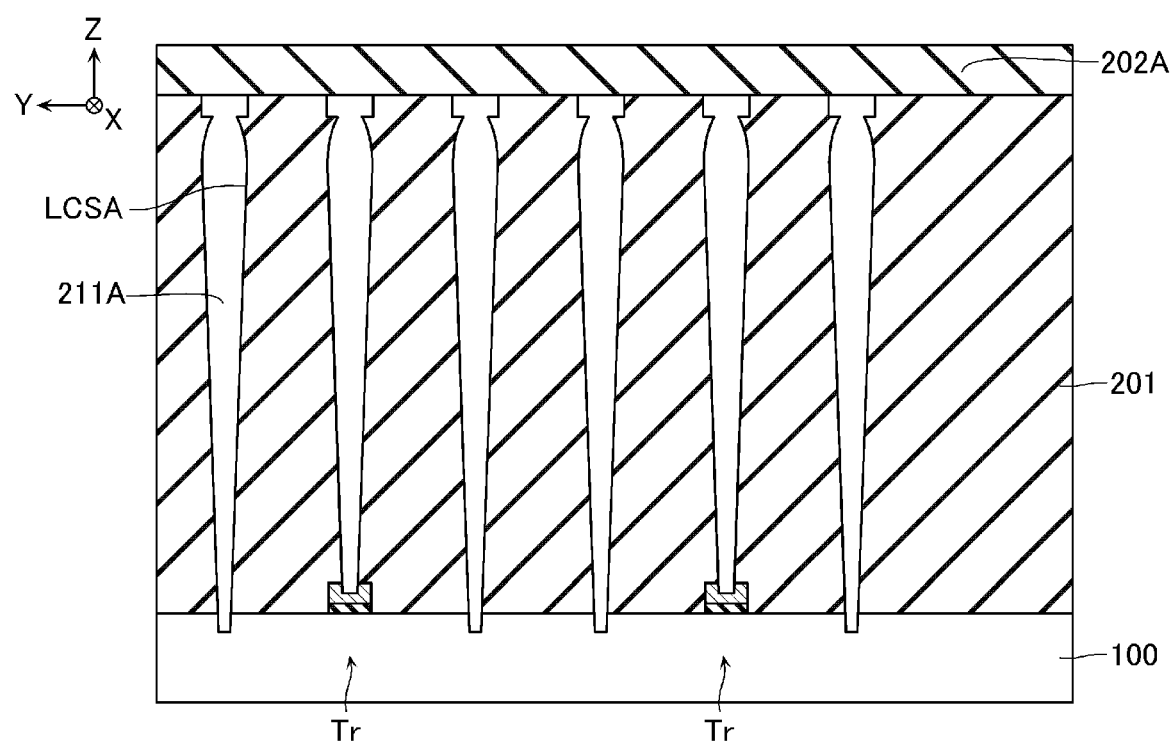

In the manufacturing method, for example, as illustrated in FIGS. 20 and 21, the transistors Tr are formed on the semiconductor substrate 100. Next, the insulating layers 111 of silicon oxide ($SiO_2$) or the like and the sacrificial layers 110A of silicon nitride ($Si_3N_4$) are alternately formed on the semiconductor substrate 100 by, means such as CVD. Further, for example, some of the insulating layers 111 and the sacrificial layers 110A are removed, and the insulating layer 201 is formed by means such as CVD. For example, memory holes LMH penetrating through the plurality of insulating layers 111 and the sacrificial layer 110A are formed by means such as RIE. Sacrificial layers 121A of amorphous silicon or the like are formed in the memory holes LMH by means such as CVD, respectively. Contact holes LCSA penetrating through the insulating layer 201 are formed by means such as RIE. Further, the sacrificial layer 211A of amorphous silicon or the like is formed in the contact hole LCSA by means of, for example, CVD. Next, a sacrificial layer 202A of silicon nitride or the like is formed on the upper surface of these configurations by means of CVD or the like.

Figure 22:
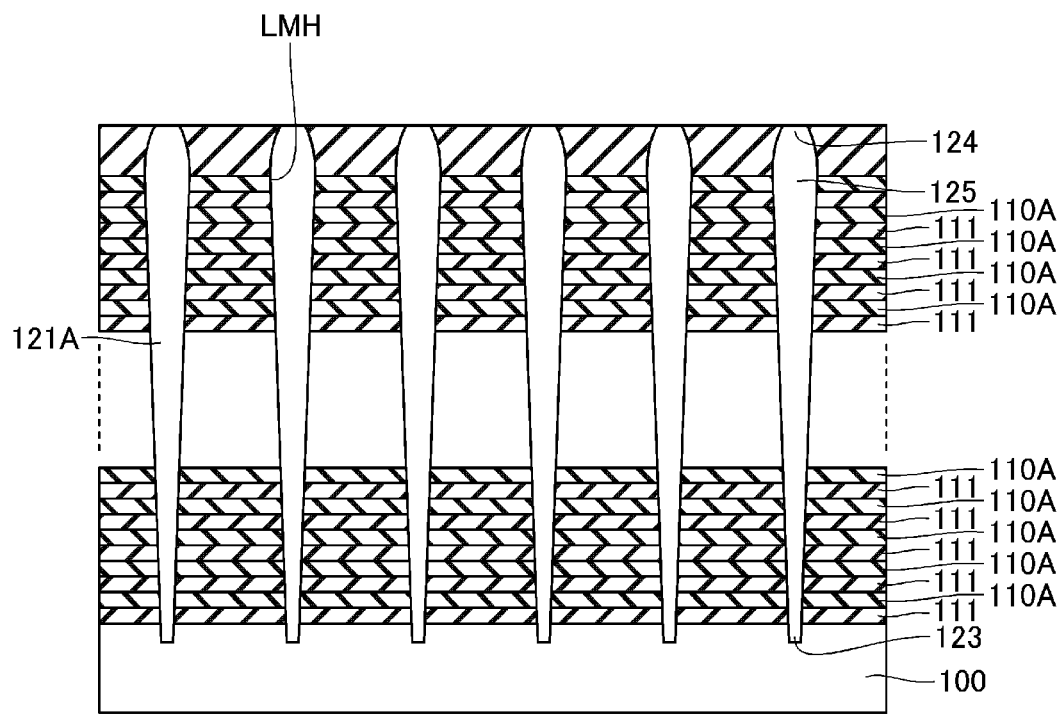
Figure 23:
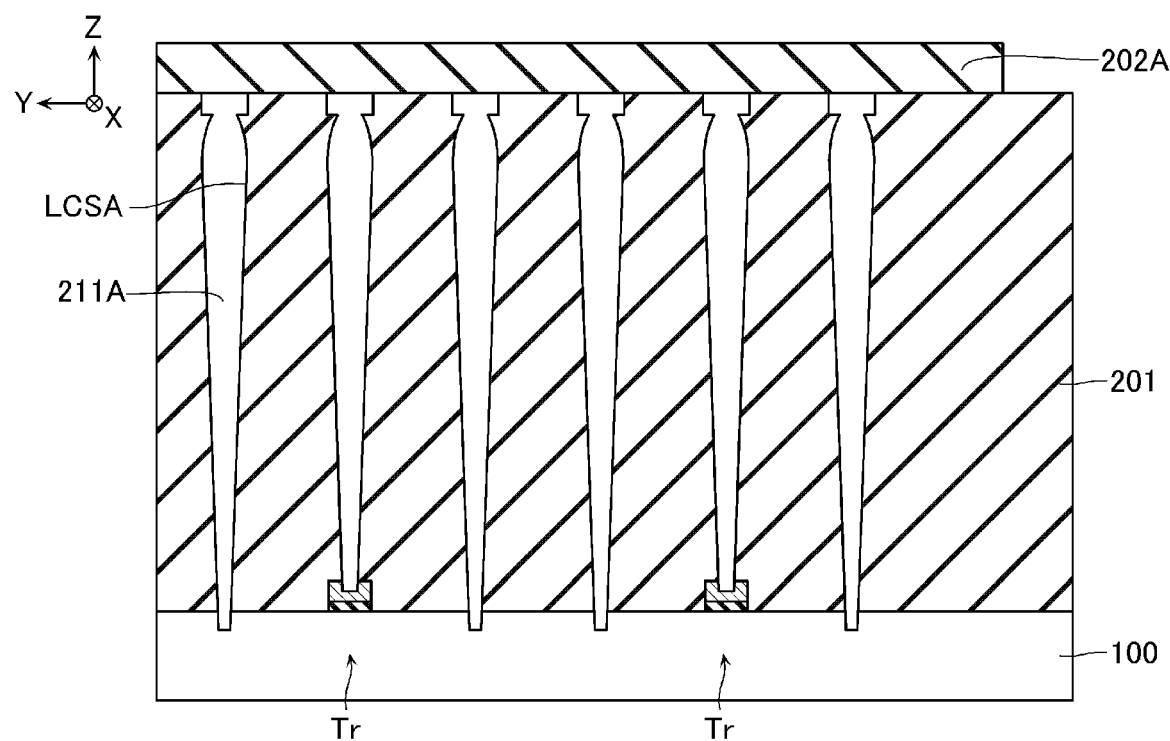

Next, as illustrated in FIGS. 22 and 23, for example, a part of the sacrificial layer 202A is removed by means such as RIE. The sacrificial layer 202A remains, for example, in the region where the void layer 202 is provided.

Figure 24:
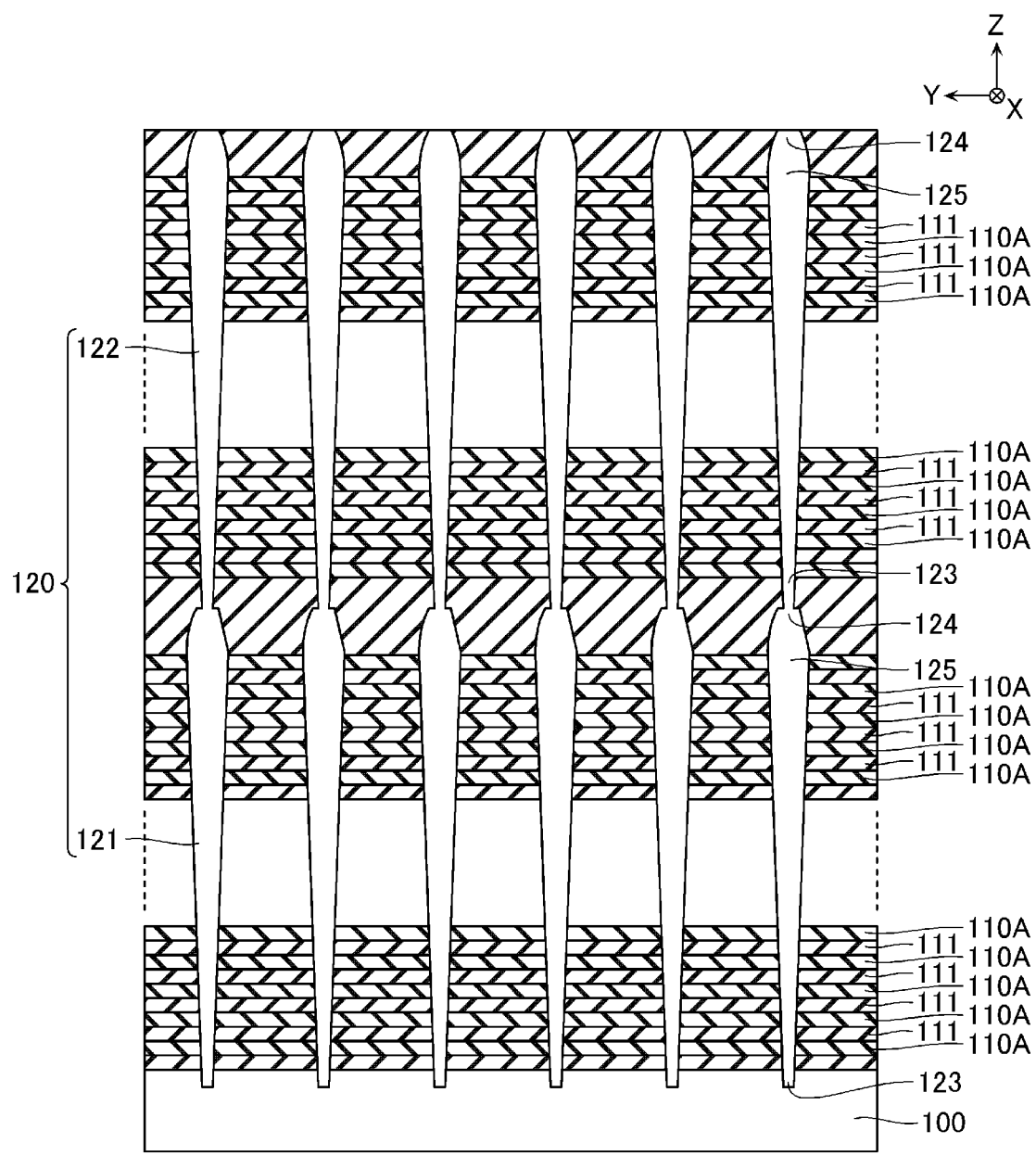
Figure 25:
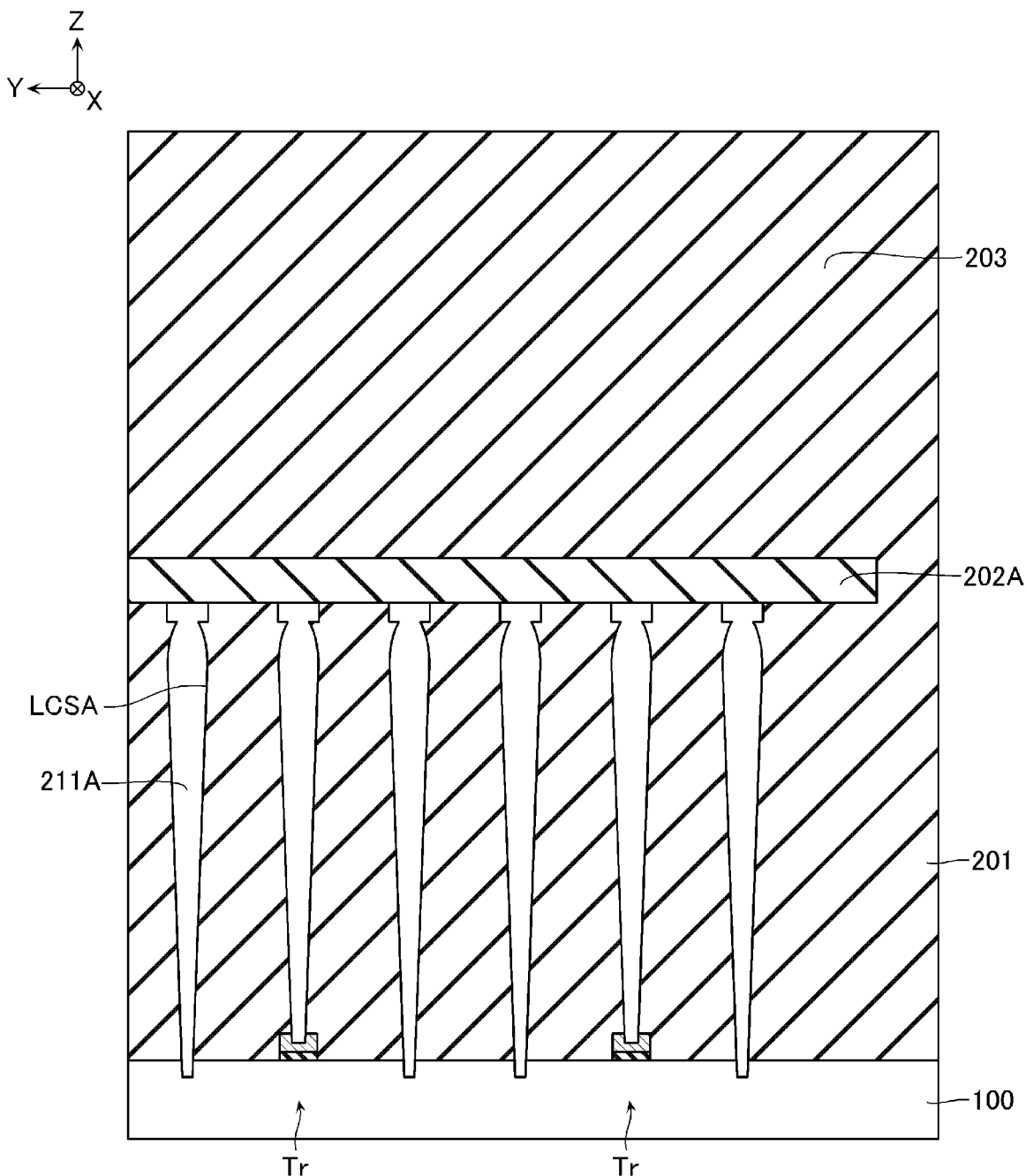

Next, as illustrated in FIGS. 24 and 25, for example, the insulating layers 111 of silicon oxide or the like and sacrificial layers 110A of silicon nitride or the like are alternately formed on the upper surfaces of these configurations. For example, the insulating layers 111 and the sacrificial layers 110A are partially removed, and the insulating layer 203 is formed by means such as CVD. Further, memory holes UMH penetrating through the plurality of insulating layers 111 and the sacrificial layer 110A are formed by means such as RIE. The sacrificial layer 121A (FIG. 22) is removed by means of wet etching, for example, to expose the inner circumferential surface and the bottom surface of the memory hole LMH. Further, the gate insulating film and the semiconductor layer 120 (not illustrated) are formed in the memory holes LMH and UMH by means of, for example, CVD.

Figure 26:
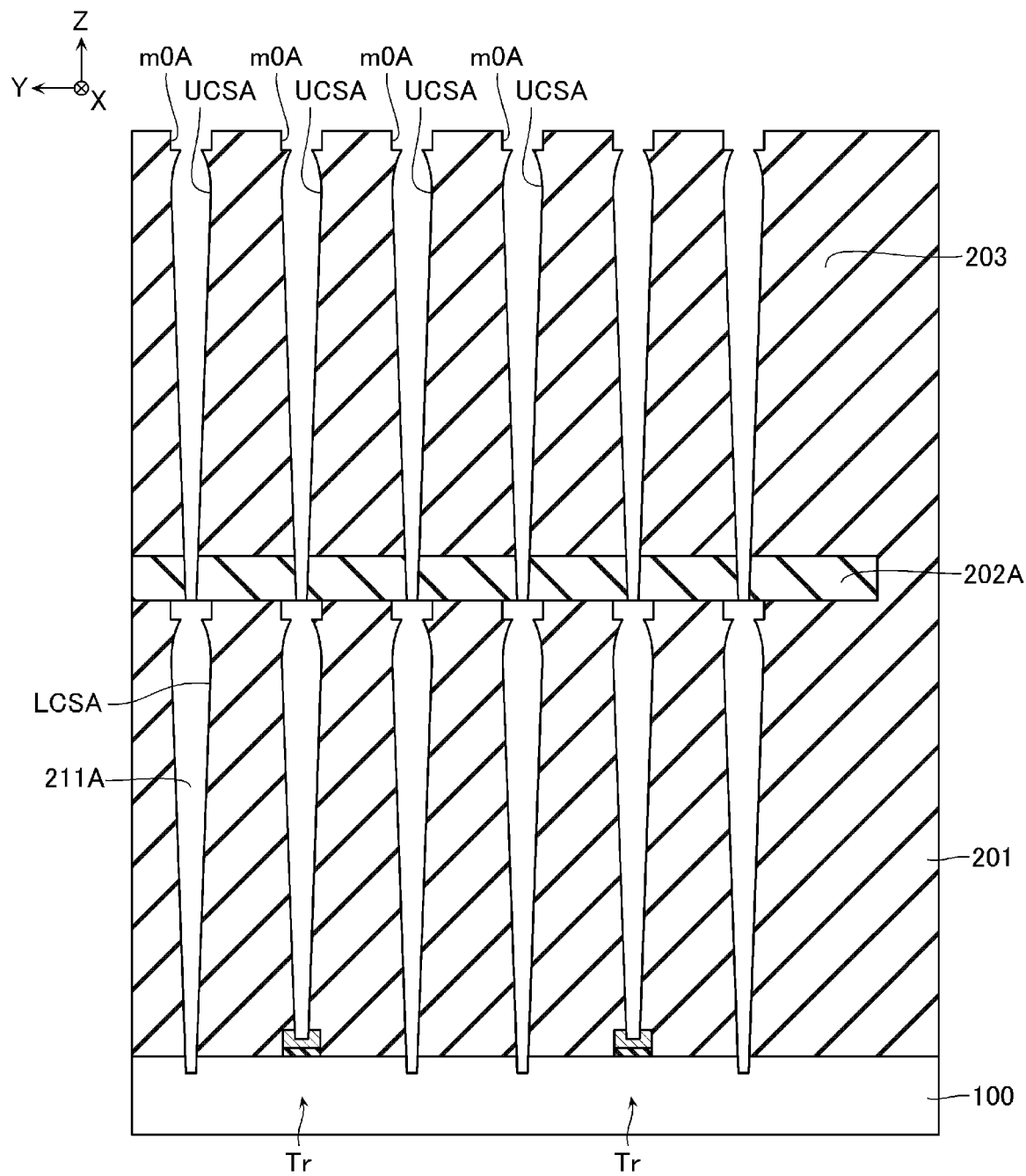

Next, as illustrated in FIG. 26, for example, contact holes UCSA penetrating through the insulating layer 203, the sacrificial layer 202A, and the insulating layer 201 are formed by means such as RIE. For example, grooves m0A connected to the contact holes UCSA are formed by means such as RIE.

Figure 27:
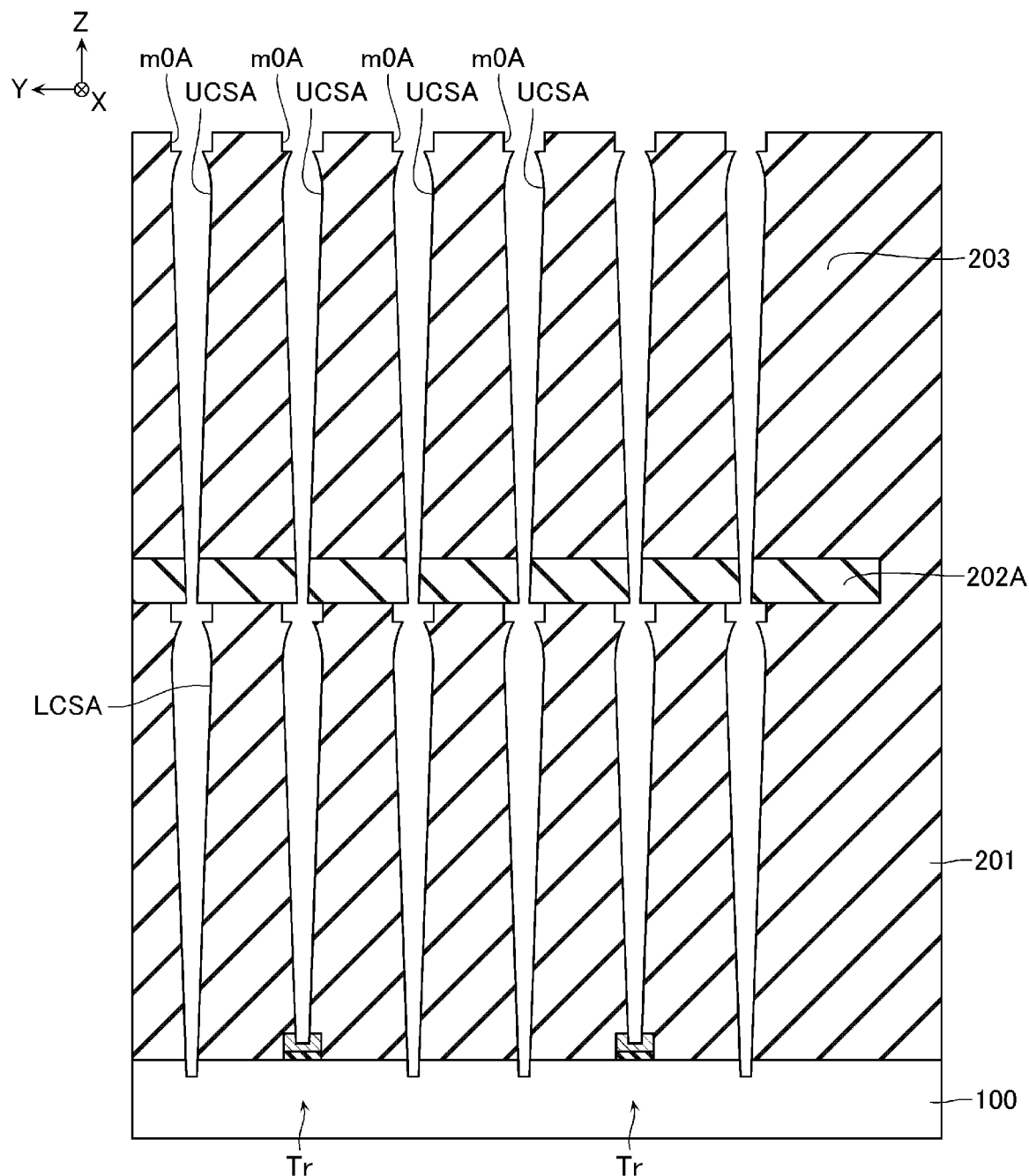

Next, as illustrated in FIG. 27, for example, the sacrificial layer 211A (FIG. 26) is removed by means such as wet etching through the contact hole UCSA to expose the inner circumferential surface and the bottom of the contact hole LCSA.

Figure 28:
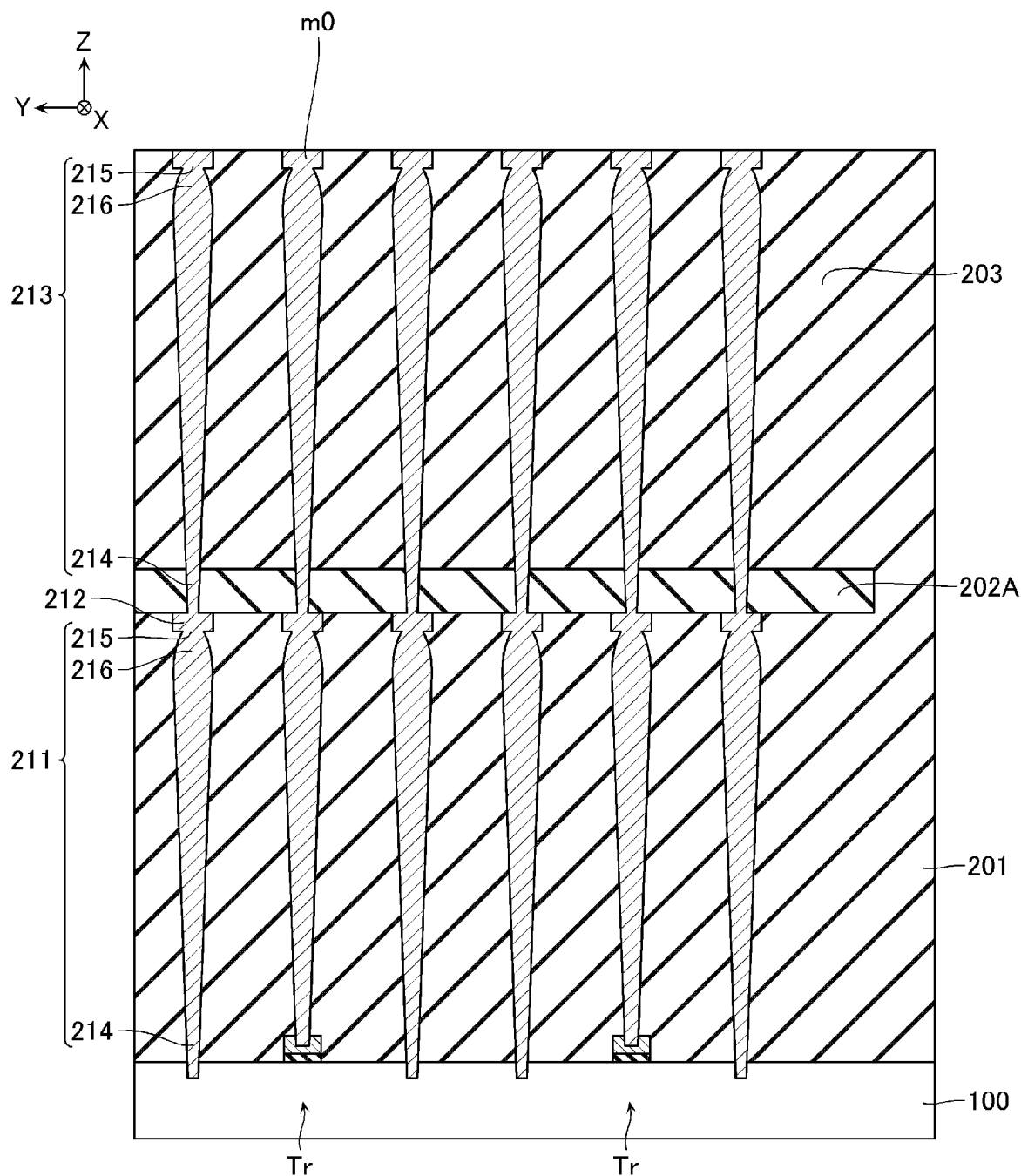

Next, for example, as illustrated in FIG. 28, the contacts CS and the wirings m0 are formed. This process is performed, for example, in the same manner as the process described with reference to FIGS. 13 and 14.

Figure 29:
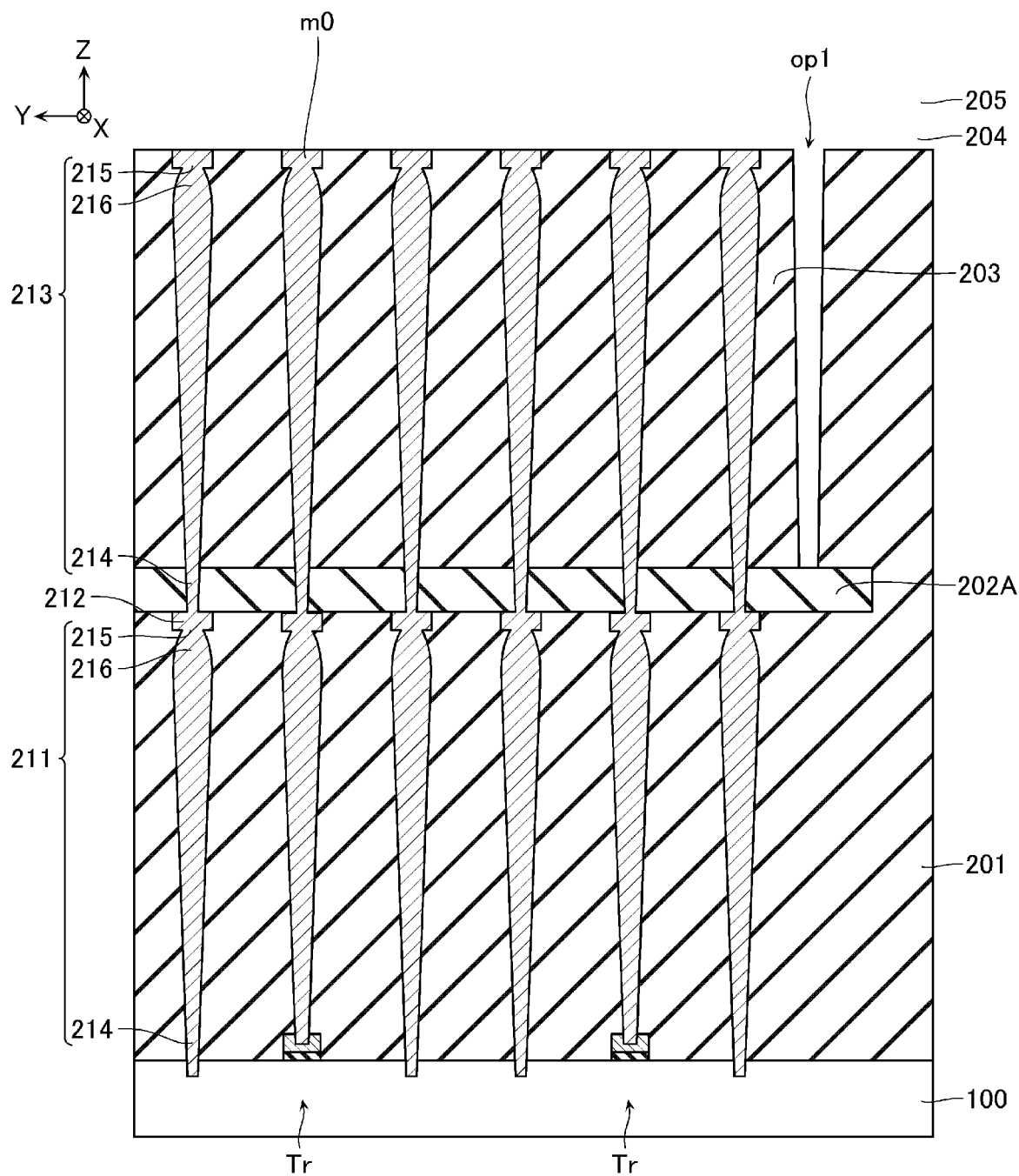

Next, as illustrated in, for example, FIG. 29, the opening op1 penetrating through the insulating layer 203 is formed. This process is performed, for example, in the same manner as the process described with reference to FIG. 15.

Thereafter, as illustrated in FIG. 19, for example, the sacrificial layer 202A is removed to form the void layer 202, and the void layer 202 is expanded to form the insulating layer 204. The insulating layer 205 is formed by means such as CVD. This process is performed, for example, in the same manner as the process after the process described with reference to FIG. 16.

Further, for example, as illustrated in FIG. 18, the plurality of sacrificial layers 110A are removed by means such as wet etching, and the conductive layers 110 are formed by means such as CVD.

Third Embodiment

Configuration

Next, with reference to FIG. 30, a semiconductor storage device according to a third embodiment will be described. In the following description, the same parts as those in the first embodiment are denoted by the same reference numerals, and the description thereof will be omitted.

Figure 30:
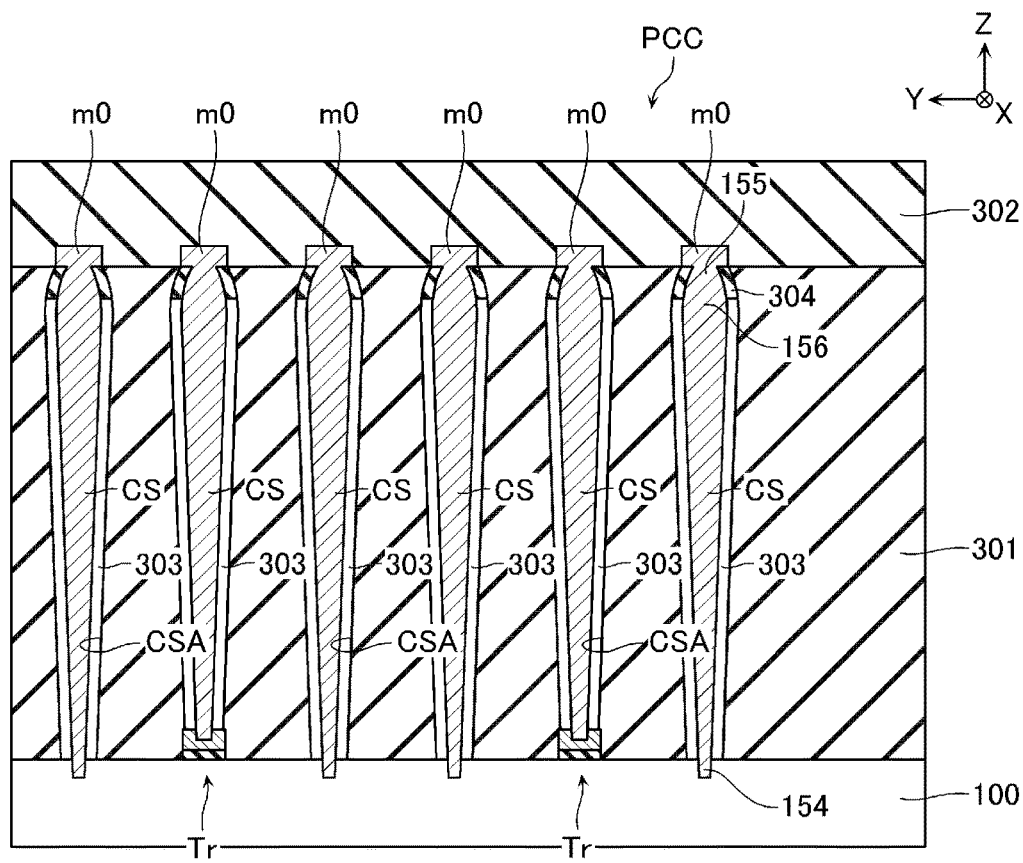
FIG. 30 illustrates a schematic cross-sectional view of a peripheral circuit according to a third embodiment.

FIG. 30 illustrates a schematic cross-sectional view of a configuration example of a peripheral circuit PCC according to the present embodiment. The peripheral circuit PCC according to the present embodiment includes an insulating layer 301 of silicon oxide ($SiO_2$) or the like provided on the semiconductor substrate 100. The peripheral circuit PCC also includes a plurality of contacts CS penetrating through the insulating layer 301 and extending in the −Z direction and arranged in the X-direction and the Y-direction and wirings m0 provided on the upper end of the contacts CS. The peripheral circuit PCC also includes an insulating layer 302 of silicon oxide ($SiO_2$) or the like provided on the upper surface of the insulating layer 301 and the wirings m0.

The insulating layer 301 has a plurality of contact holes CSA penetrating through the insulating layer 301 and extending in the Z-direction. The contacts CS are respectively provided in the plurality of contact holes CSA. Voids 303 are respectively provided between the inner circumferential surfaces of the contact holes CSA and the outer circumferential surfaces of the contacts CS. Each void 303 extends in the Z-direction over a predetermined range. In the illustrated example, each void 303 is provided between the outer circumferential surface from the lower end portion 154 of the contact CS to a portion above the bowing portion 156 and the inner circumferential surface of the contact hole CSA.

Insulating layers 304 are respectively provided between the upper ends of the contact holes CSA and the upper end portions 155 of the contacts CS. Each insulating layer 304 is in contact with the inner circumferential surface of the upper end of the contact hole CSA and the outer circumferential surface of the upper end of the contact CS to close each void 303. The lower end of each insulating layer 304 is exposed to the void 303. Each insulating layer 304 contains, for example, a low dielectric such as silicon carbide (SiC).

Manufacturing Method

Next, with reference to FIGS. 31 to 38, a method of manufacturing the semiconductor storage device according to the present embodiment will be illustrated. FIGS. 31 to 38 illustrate schematic cross-sectional views of a structure to illustrate process steps of the manufacturing method in this order.

Figure 31:
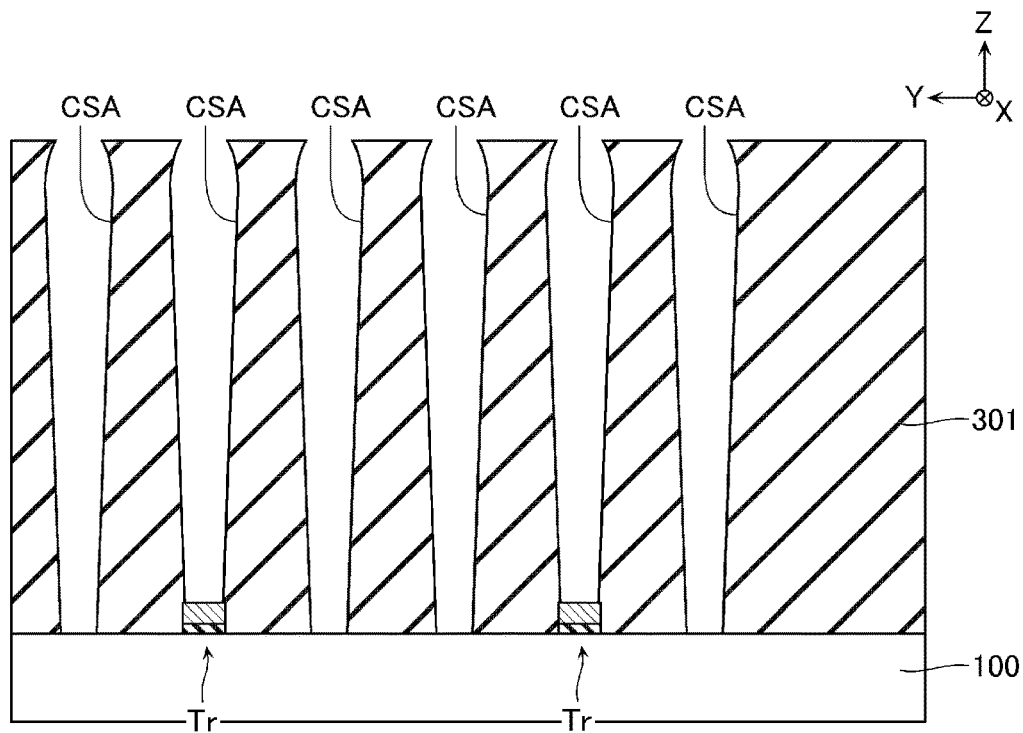
FIGS. 31-38 illustrate aspects of a manufacturing method of a peripheral circuit according to a third embodiment.

In the manufacturing method, for example, as illustrated in FIG. 31, the transistors Tr are formed on the semiconductor substrate 100. Next, the insulating layer 301 is formed on the semiconductor substrate 100 by means such as CVD using gas such as TEOS, for example. Next, contact holes CSA penetrating through the insulating layer 301 and extending in the Z-direction are formed by means such as RIE.

Figure 32:
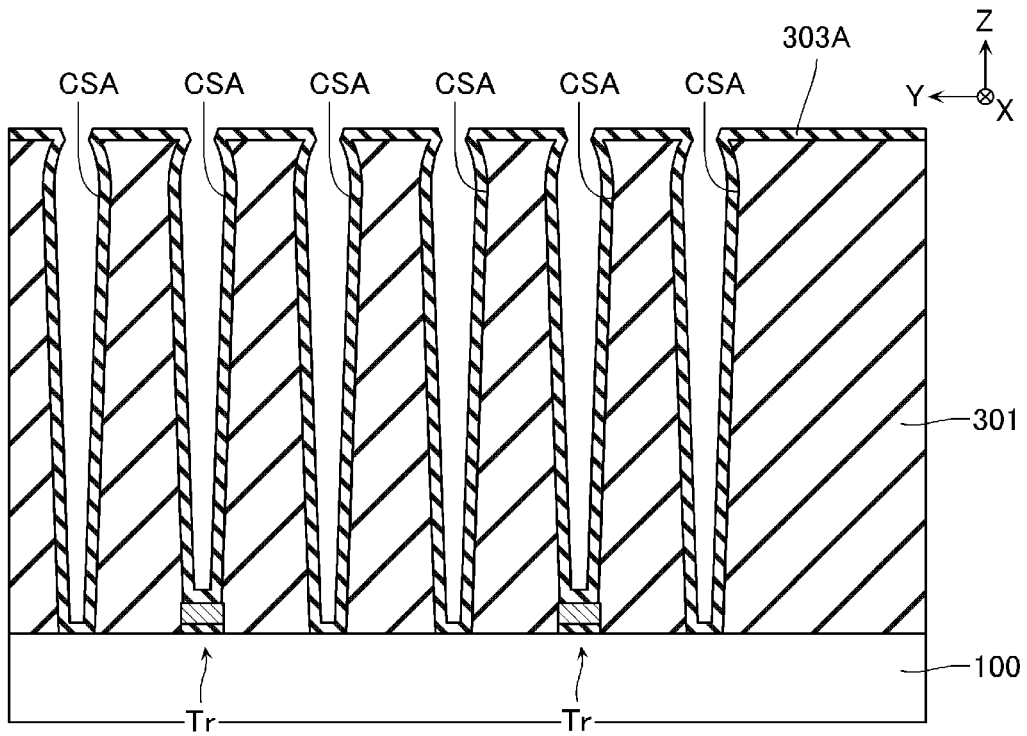

Next, as illustrated in FIG. 32, for example, a sacrificial layer 303A of silicon nitride ($Si_3N_4$) or the like is formed on the inner circumferential surfaces and the bottom surfaces of the contact holes CSA by means of, for example, CVD.

Figure 33:
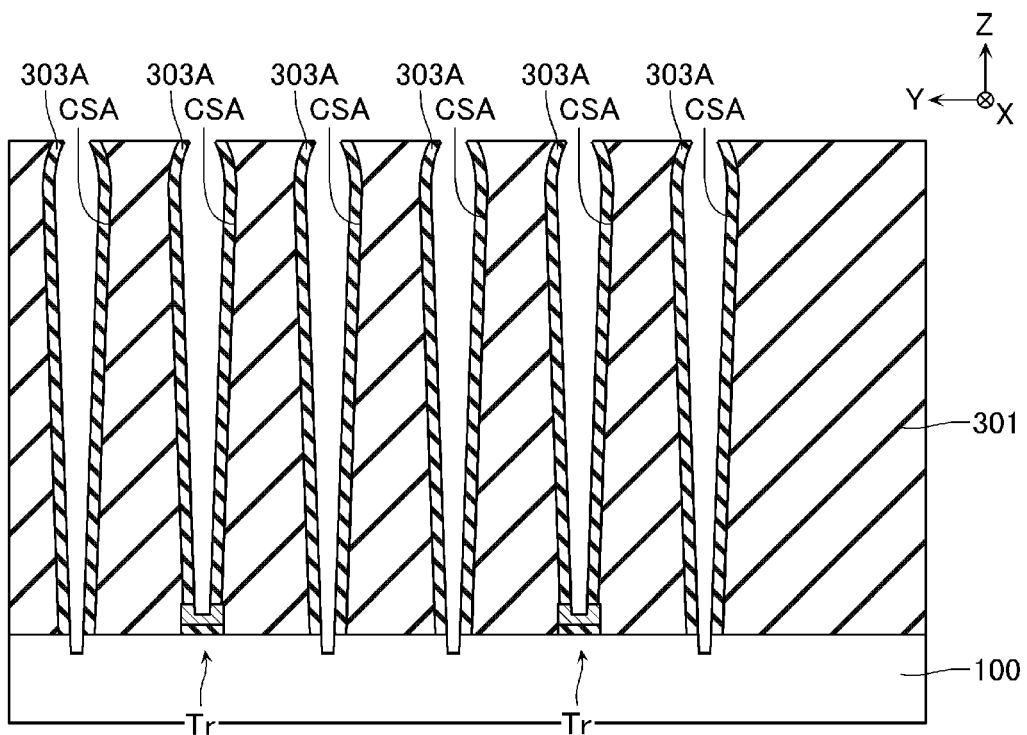

Next, as illustrated in FIG. 33, for example, a portion of the sacrificial layer 303A provided on the bottom surfaces of the contact holes CSA is removed by means of, for example, RIE.

Figure 34:
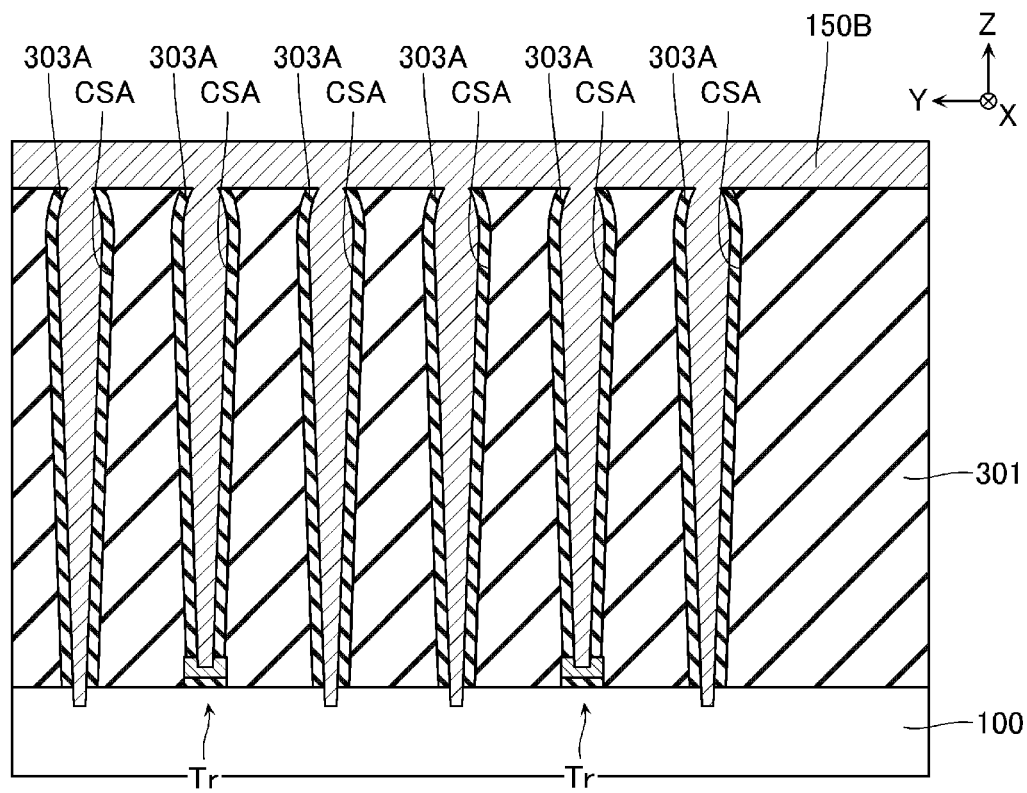

Next, as illustrated in FIG. 34, for example, a conductive layer 150B is formed. For example, the barrier conductive layers 152 (FIG. 5) and the conductive layers 153 (FIG. 5)

are formed on the inner circumferential surfaces of the sacrificial layer 303A by means such as CVD.

Figure 35:
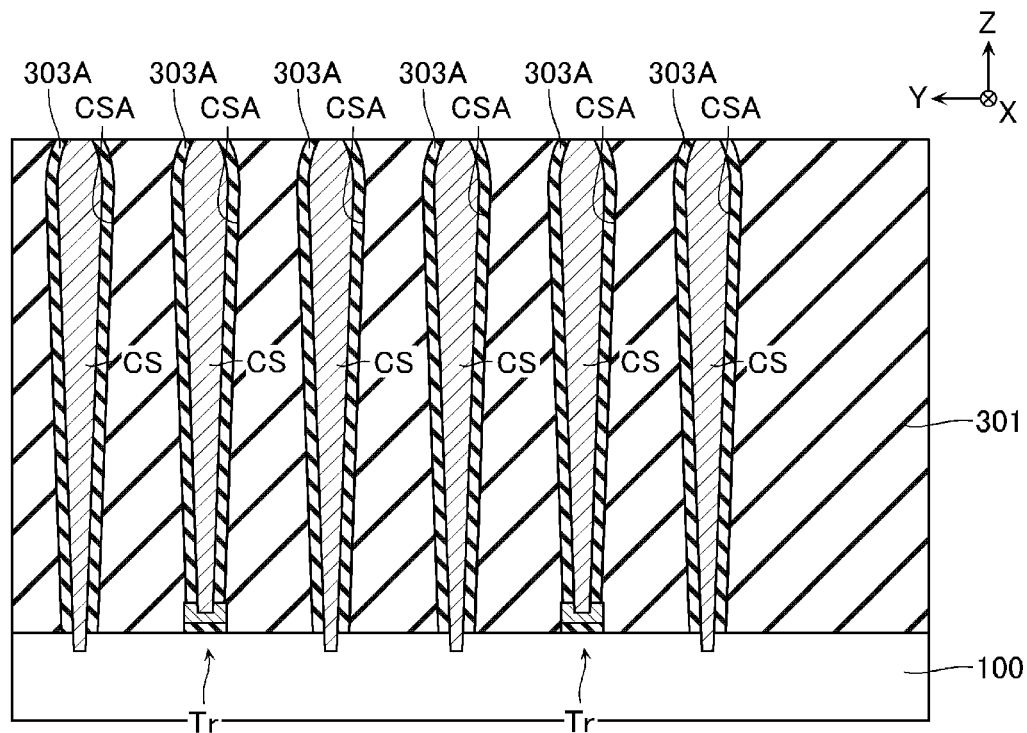

Next, as illustrated in FIG. 35, for example, a part of the conductive layer 150B is removed by a method such as CMP to form contacts CS.

Figure 36:
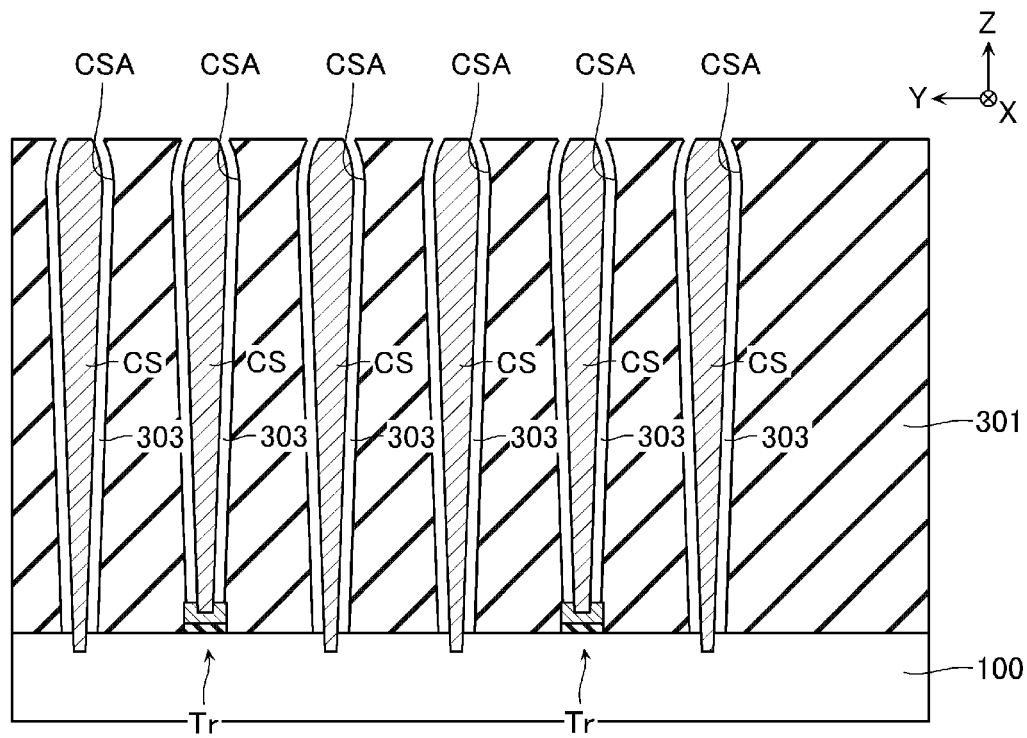

Next, as illustrated in FIG. 36, for example, the sacrificial layer 303A is removed by means such as wet etching to expose the inner circumferential surfaces of the contact holes CSA and the outer circumferential surfaces of the contacts CS, thereby forming void layers 303.

Figure 37:
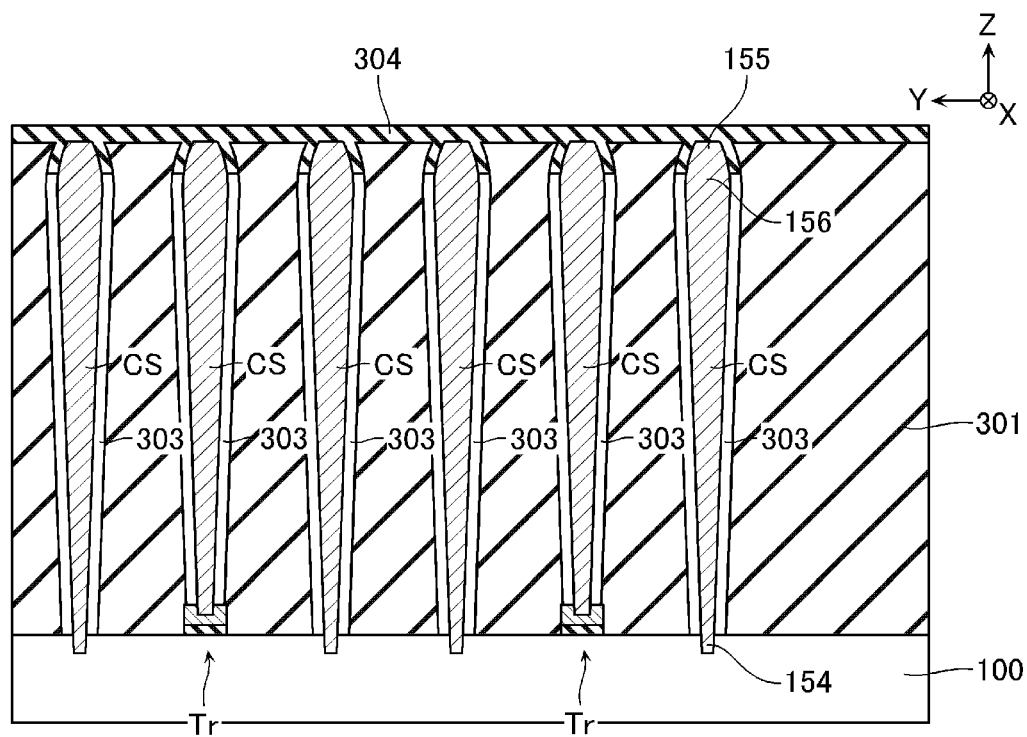

Next, as illustrated in FIG. 37, for example, the insulating layer 304 is formed by means such as CVD. As a result, the voids 303 are closed and separated from the external space.

Figure 38:
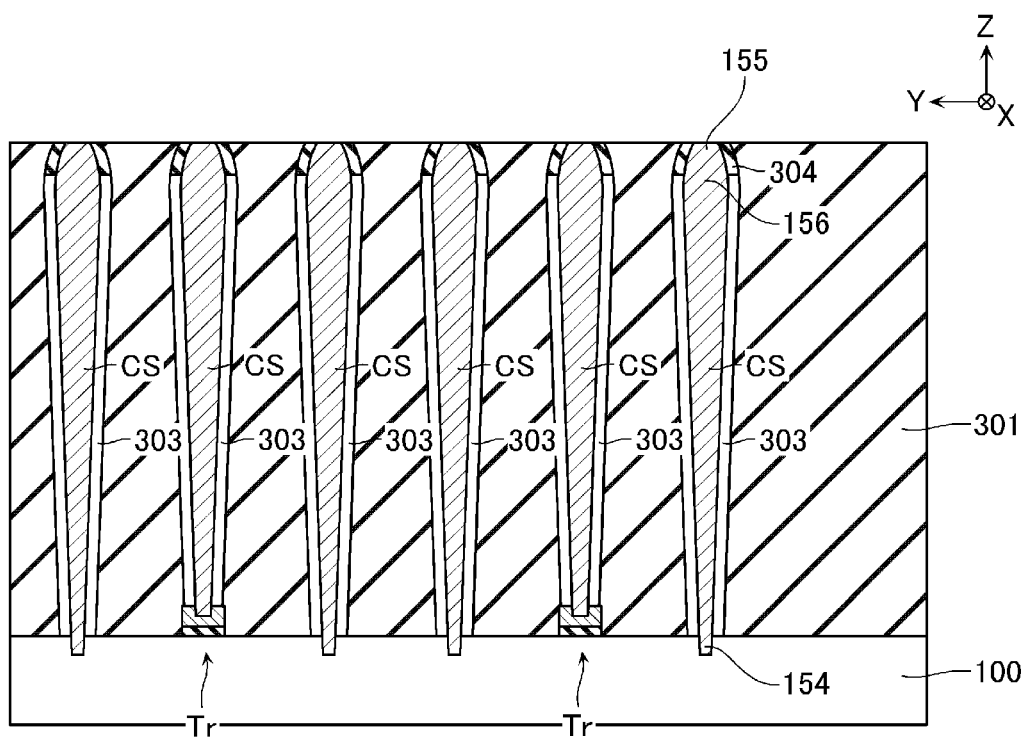

Next, as illustrated in, for example, FIG. 38, a part of the insulating layer 304 is removed by a method such as CMP.

Thereafter, as illustrated in FIG. 30, for example, the wirings m0 and the insulating layer 302 are formed by means such as CVD and RIE.

Fourth Embodiment

Next, with reference to FIG. 39, a semiconductor storage device according to a fourth embodiment will be described. In the following description, the same parts as those in the first to third embodiments are denoted by the same reference numerals, and the description thereof will be omitted.

Figure 39:
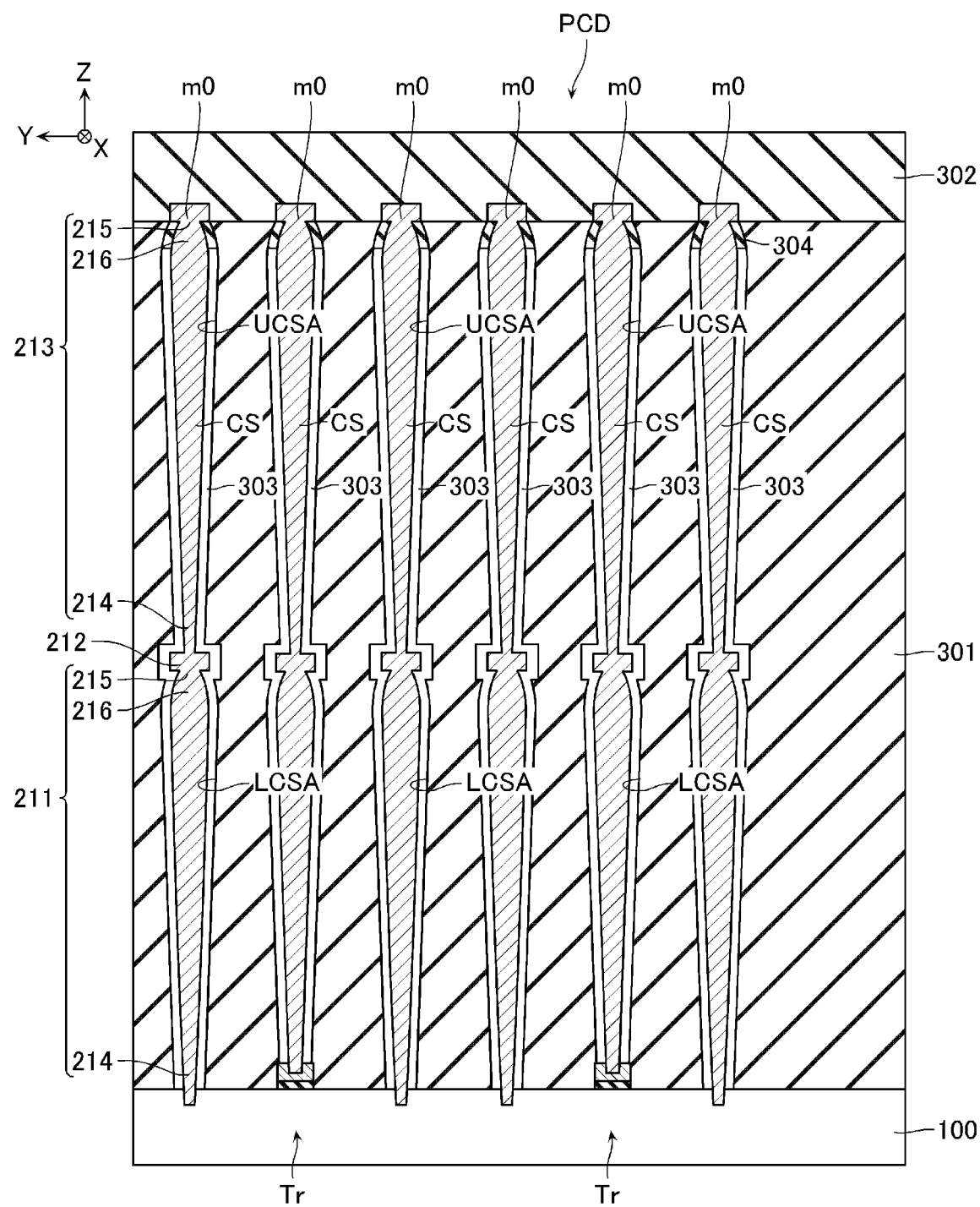
FIG. 39 illustrates a schematic cross-sectional view of a peripheral circuit according to a fourth embodiment.

FIG. 39 illustrates a schematic cross-sectional view of a configuration example of a peripheral circuit PCD according to the present embodiment. Similar to the peripheral circuit PCC (FIG. 30) according to the third embodiment, the peripheral circuit PCD according to the present embodiment includes the insulating layer 301 provided on the semiconductor substrate 100, the plurality of contacts CS penetrating through the insulating layer 301, and the wirings m0 provided on the upper end of the contacts CS, and the insulating layer 302 provided on the upper surfaces of the insulating layer 301 and the wirings m0. In the peripheral circuit PCD according to the present embodiment, each contact CS includes the contact portion 211, the connection portion 212, and the contact portion 213, similarly as in the peripheral circuit PCB (FIG. 19) according to the second embodiment.

The insulating layer 301 has a plurality of contact holes LCSA and UCSA penetrating through the insulating layer 301 and extending in the Z-direction. The contacts CS are respectively provided inside the plurality of contact holes LCSA and UCSA. Voids 303 are respectively provided between the inner circumferential surfaces of the contact holes LCSA and UCSA and the outer circumferential surfaces of the contacts CS. In the illustrated example, each void 303 is provided between the outer circumferential surface from the lower end portion 214 of the contact portion 211 to a portion above the bowing portion 216 of the contact portion 213 and the inner circumferential surface of each of the contact holes LCSA and UCSA.

Fifth Embodiment

Next, with reference to FIG. 40, a semiconductor storage device according to a fifth embodiment will be described. In the following description, the same parts as those in the first to fourth embodiments are denoted by the same reference numerals, and the description thereof will be omitted.

Figure 40:
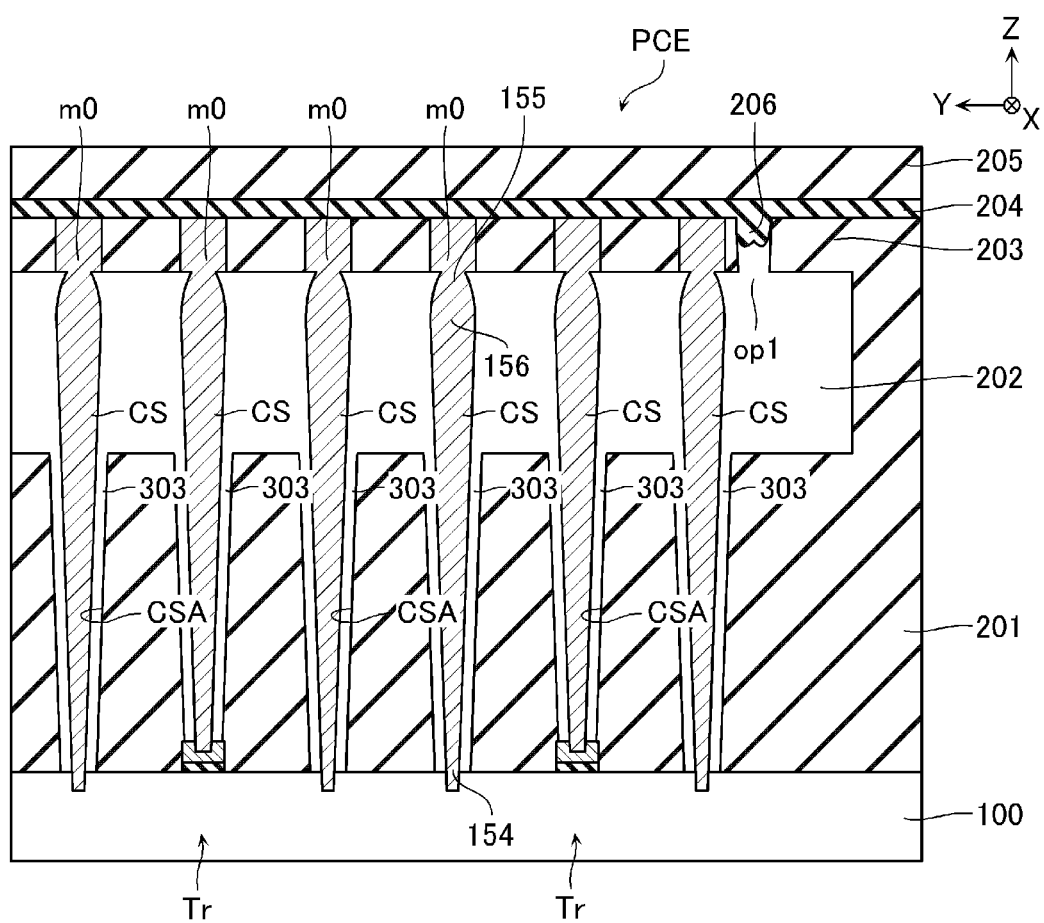
FIG. 40 illustrates a schematic cross-sectional view of a peripheral circuit according to a fifth embodiment.

FIG. 40 illustrates a schematic cross-sectional view of a configuration example of a peripheral circuit PCE according to the present embodiment. As illustrated, a peripheral circuit PCE according to the present embodiment is configured substantially the same as the peripheral circuit PCA (FIG. 8) according to the first embodiment. For example, the peripheral circuit PCE according to the present embodiment includes the insulating layer 201, the void layer 202, and the insulating layer 203. Further, in the peripheral circuit PCE according to the present embodiment, similarly to the peripheral circuit PCC (FIG. 30) according to the third embodiment, each void 303 is provided between the inner circumferential surface of the contact hole CSA and the outer circumferential surface of the contact CS.

In the illustrated example, the bowing portion 156 of the contact CS is provided in the void layer 202. Each void 303 is provided between the outer circumferential surface from the lower end portion 154 of the contact CS to a portion corresponding to the void layer 202 and the contact hole CSA. Each void 303 communicates with the void layer 202.

Manufacturing Method

Next, with reference to FIGS. 41 to 46, a method of manufacturing the semiconductor storage device according to the present embodiment will be illustrated. FIGS. 41 to 46 illustrate schematic cross-sectional views of a structure to illustrate process steps of the manufacturing method in this order.

Figure 41:
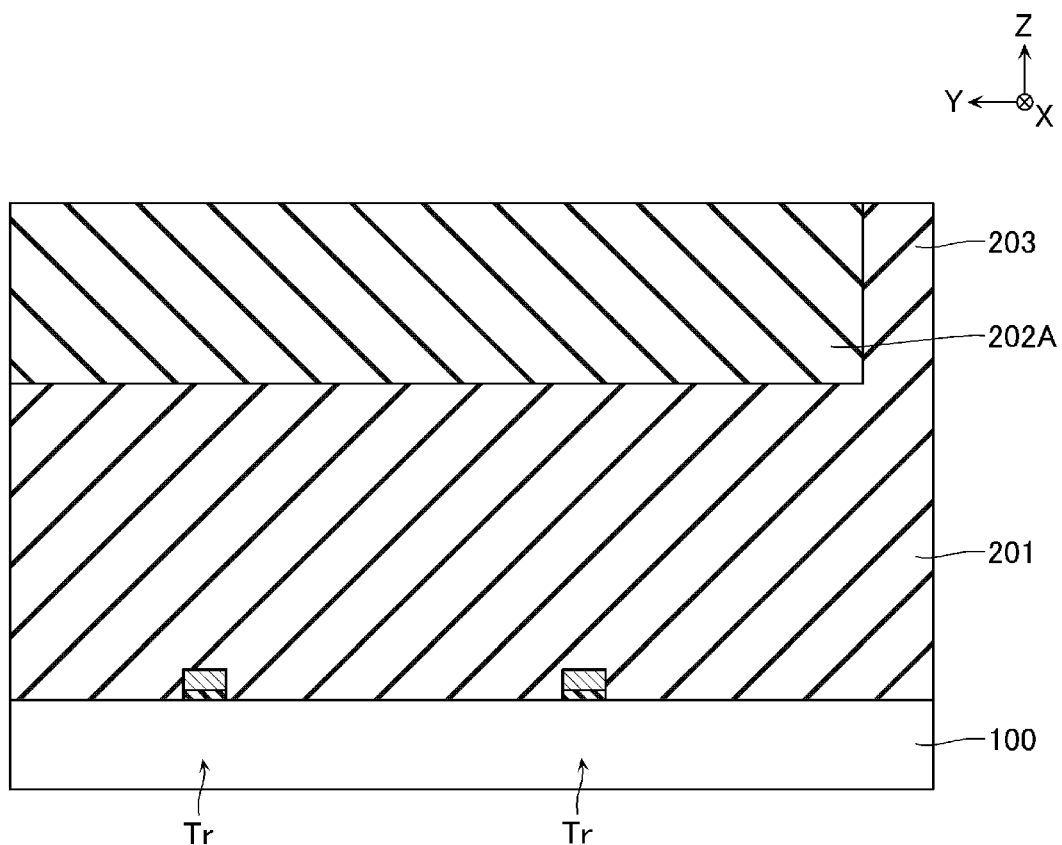
FIGS. 41-46 illustrate aspects of a manufacturing method of a peripheral circuit according to a fifth embodiment.

In the manufacturing method, for example, as illustrated in FIG. 41, the transistors Tr, the insulating layer 201, the sacrificial layer 202A, and the insulating layer 203 are formed. This process is performed, for example, in the same manner as the process described with reference to FIGS. 9 to 11. However, in the process described with reference to FIG. 11, the upper surface of the sacrificial layer 202A may be exposed by means such as RIE.

Figure 42:
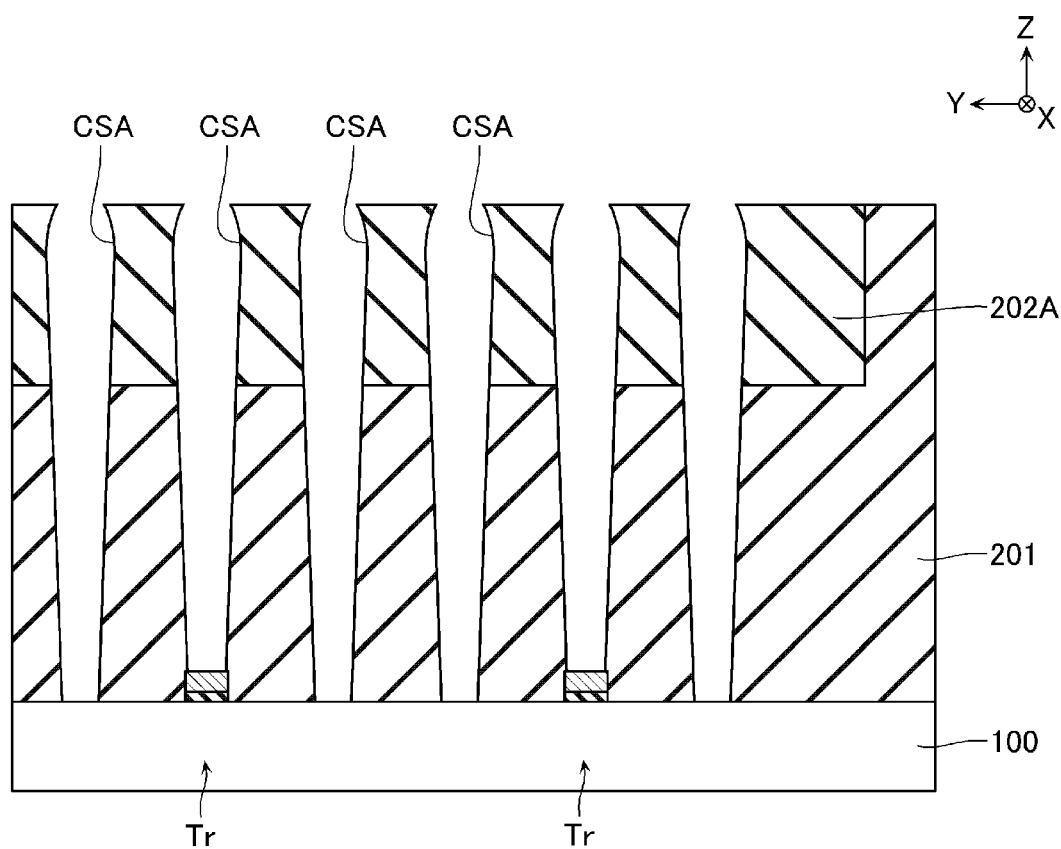

Next, as illustrated in FIG. 42, for example, contact holes CSA penetrating through the sacrificial layer 202A and the insulating layer 201 and extending in the Z-direction are formed by means such as RIE.

Figure 43:
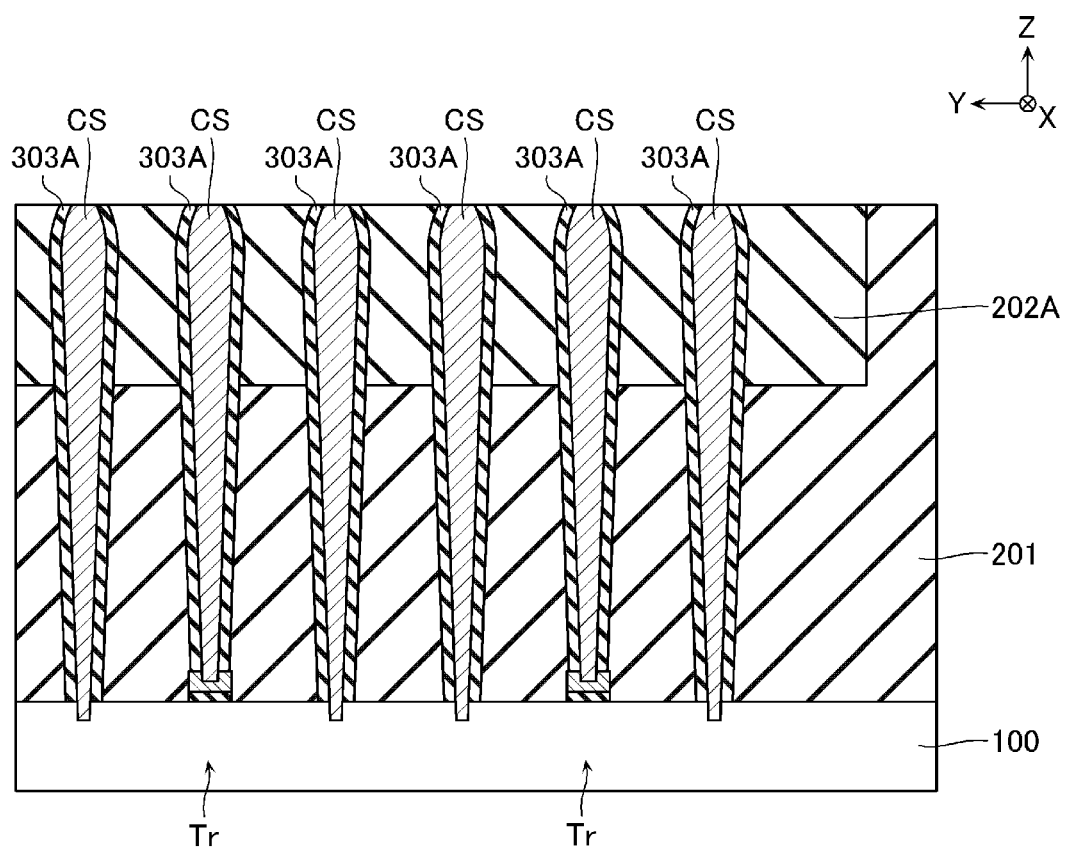

Next, as illustrated in FIG. 43, for example, the sacrificial layers 303A and the contacts CS are formed inside the contact holes CSA. This process is performed, for example, in the same manner as the process described with reference to FIGS. 32 to 35.

Figure 44:
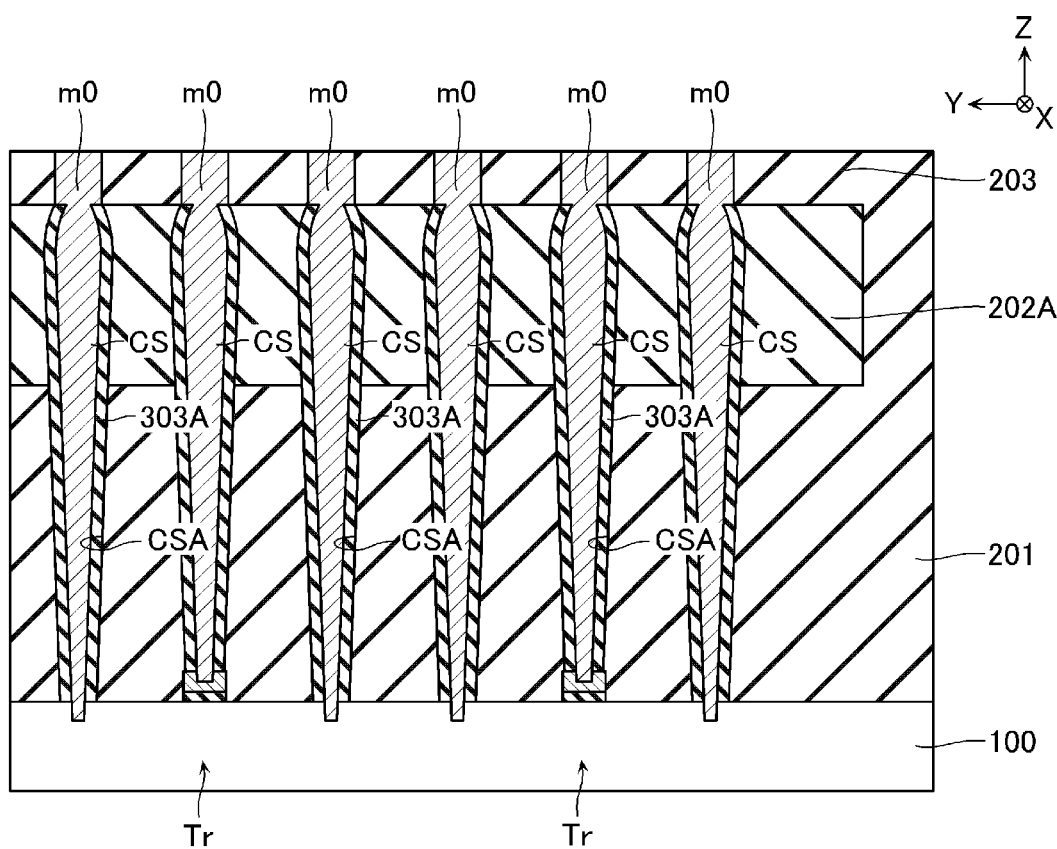

Next, for example, as illustrated in FIG. 44, the wirings m0 and the insulating layer 203 are formed by means such as CVD and RIE.

Figure 45:
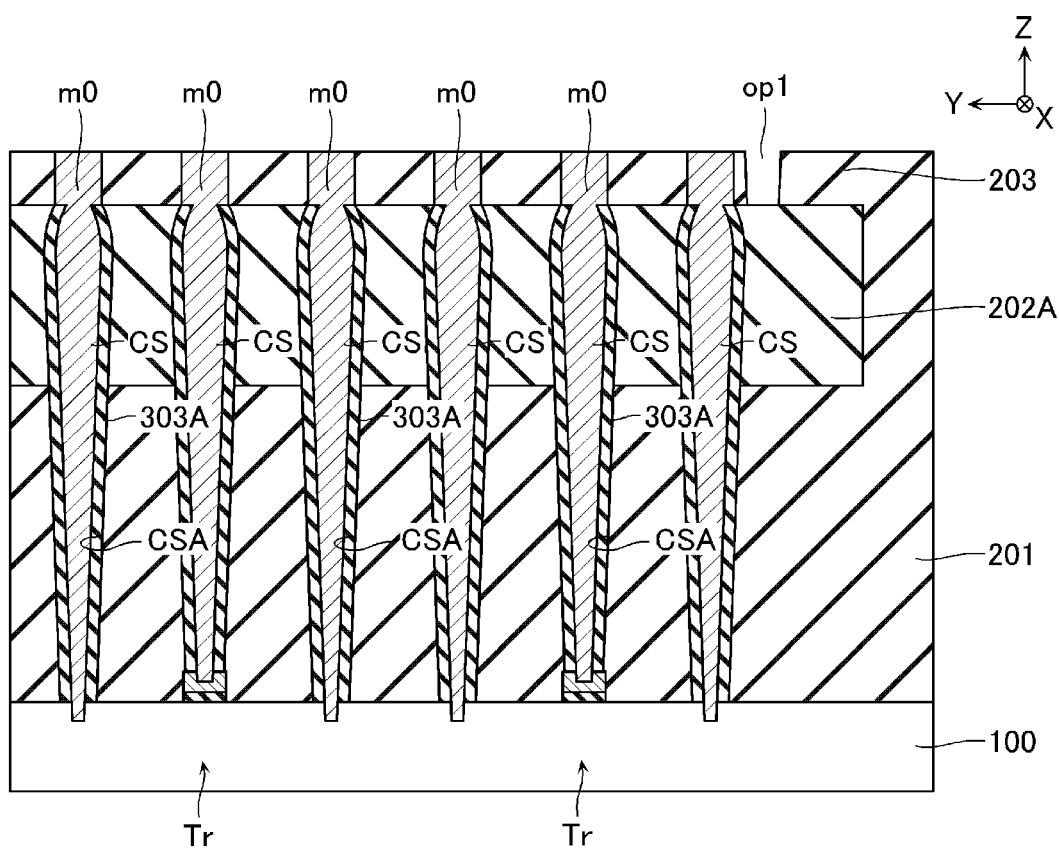

Next, as illustrated in FIG. 45, for example, the opening op1 is formed. This process is performed, for example, in the same manner as the process described with reference to FIG. 15.

Figure 46:
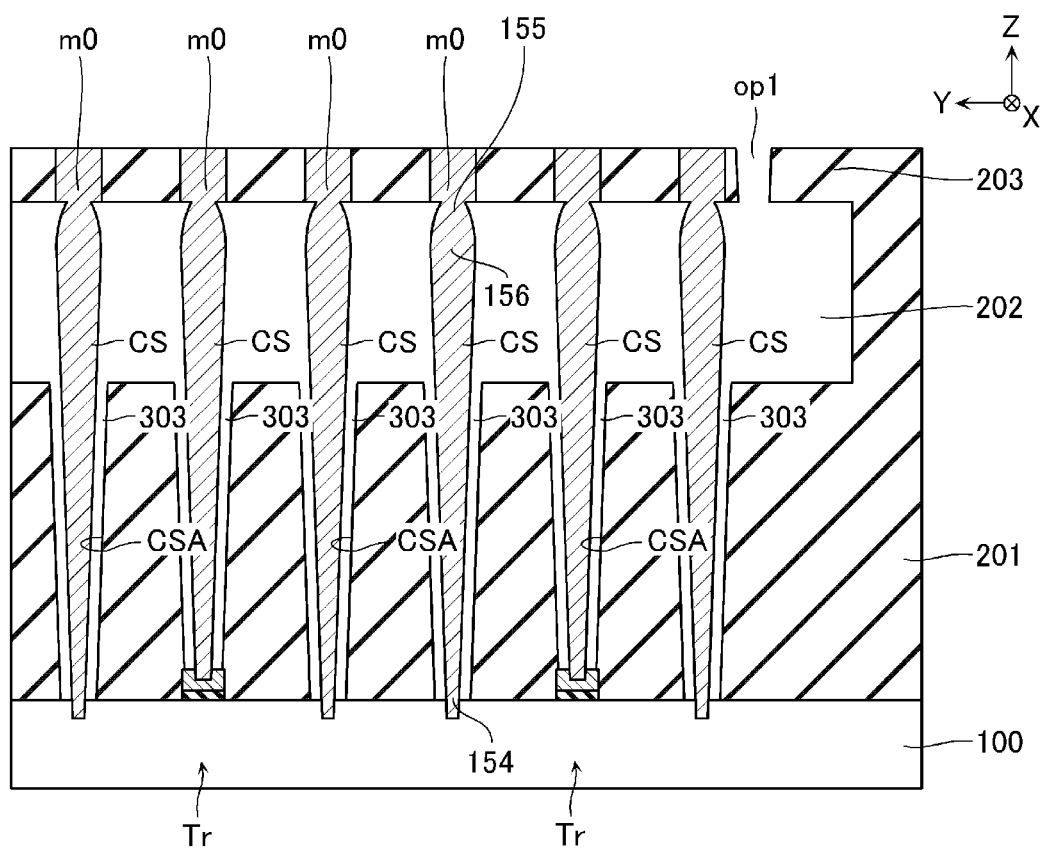

Next, as illustrated in FIG. 46, for example, the sacrificial layer 202A and the sacrificial layers 303A are removed by means such as wet etching through the opening op1, and the void layer 202 and the voids 303 are formed.

Thereafter, as illustrated in FIG. 40, for example, the insulating layer 204 such as silicon oxide ($SiO_2$) is formed by means such as plasma CVD using gas such as silane ($SiH_4$). The insulating layer 205 such as silicon oxide ($SiO_2$) is formed by means such as CVD using gas such as TEOS, for example.

Sixth Embodiment

Next, with reference to FIG. 47, a semiconductor storage device according to a sixth embodiment will be described. In the following description, the same parts as those in the first to fifth embodiments are denoted by the same reference numerals, and the description thereof will be omitted.

Figure 47:
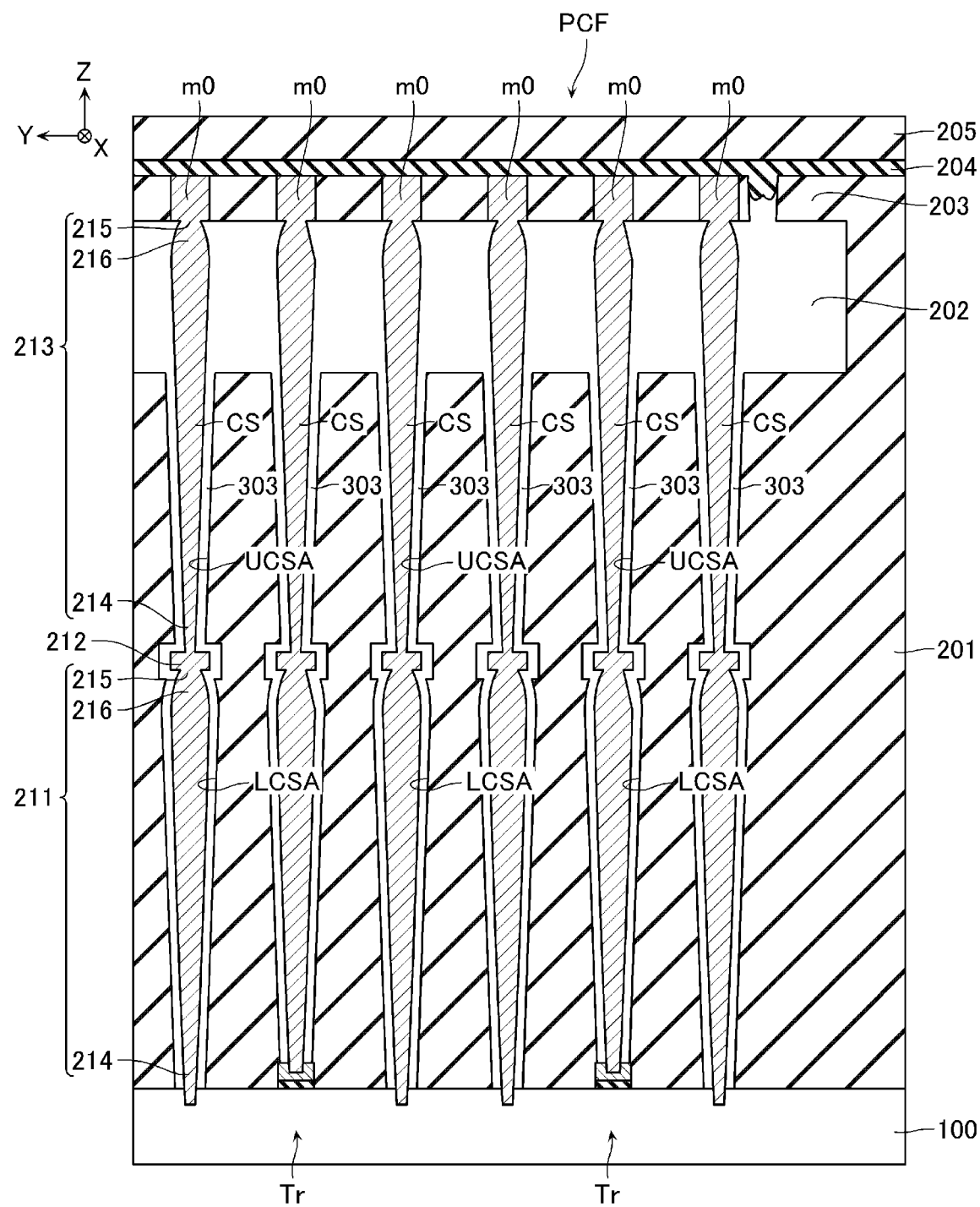
FIG. 47 illustrates a schematic cross-sectional view of a peripheral circuit according to a sixth embodiment.

FIG. 47 illustrates a schematic cross-sectional view of a configuration example of a peripheral circuit PCF according to the present embodiment. Similar to the peripheral circuit PCE (FIG. 40) according to the fifth embodiment, the peripheral circuit PCF according to the present embodiment includes the void layer 202 and the voids 303. Further, in the peripheral circuit PCF according to the present embodiment, each contact CS includes the contact portion 211, the connection portion 212, and the contact portion 213, similarly as in the peripheral circuit PCB (FIG. 19) according to the second embodiment.

In the illustrated example, bowing portions 256 of the contact portion 213 are provided in the void layer 202. Each void 303 is provided between the outer circumferential surface from the lower end portion 214 of the contact portion 211 to a portion corresponding to the void layer 202 of the contact CS and the contact holes LCSA and UCSA. Each void 303 communicates with the void layer 202.

Seventh Embodiment

Next, a semiconductor storage device according to a seventh embodiment will be described with reference to FIG. 48. In the following description, the same parts as those in the first to sixth embodiments are denoted by the same reference numerals, and the description thereof will be omitted.

Figure 48:
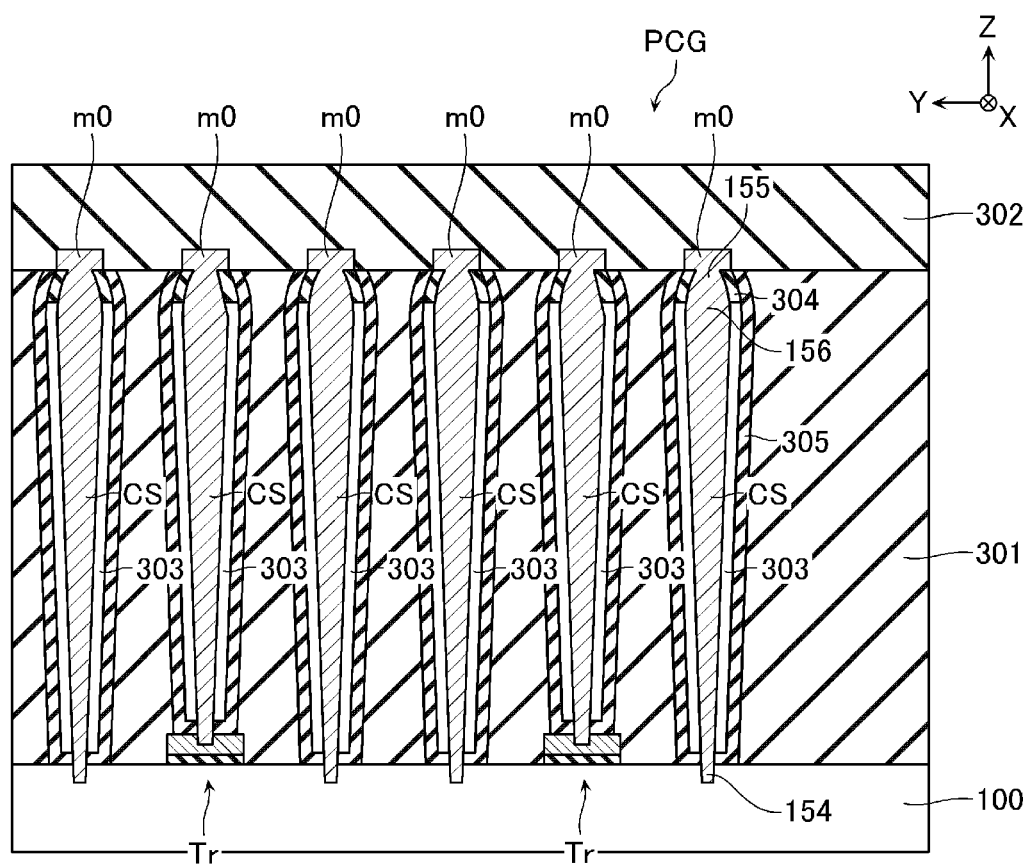
FIG. 48 illustrates a schematic cross-sectional view of a peripheral circuit according to a seventh embodiment.

FIG. 48 illustrates a schematic cross-sectional view of a configuration example of a peripheral circuit PCG according to the present embodiment. The peripheral circuit PCG according to the present embodiment is configured substantially the same as the peripheral circuit PCC (FIG. 30) according to the third embodiment. However, the peripheral circuit PCG according to the present embodiment includes a protective films 305 provided between the contacts CS and the insulating layer 301. Each protective film 305 is closer to the insulating layer 301 than the void 303. Each protective films 305 contains, for example, a low dielectric such as silicon carbide (SiC).

The semiconductor storage device according to the present embodiment is manufactured substantially in the same manner as the peripheral circuit PCC (FIG. 30) according to the third embodiment. However, when manufacturing the semiconductor storage device according to the present embodiment, each protective film 305 is formed on the inner circumferential surface and the bottom surface of the contact hole CSA in the process described with reference to FIG. 32, and then the sacrificial layer 303A is formed. The sacrificial layer 303A has, for example, a smaller etching rate than the protective film 305.

According to such a method, the insulating layer 301 can be protected when removing the sacrificial layer 303A and the width of the void 303 can be suitably controlled.

Eighth Embodiment

Next, with reference to FIG. 49, a semiconductor storage device according to an eighth embodiment will be described. In the following description, the same parts as those in the first to seventh embodiments are denoted by the same reference numerals, and the description thereof will be omitted.

Figure 49:
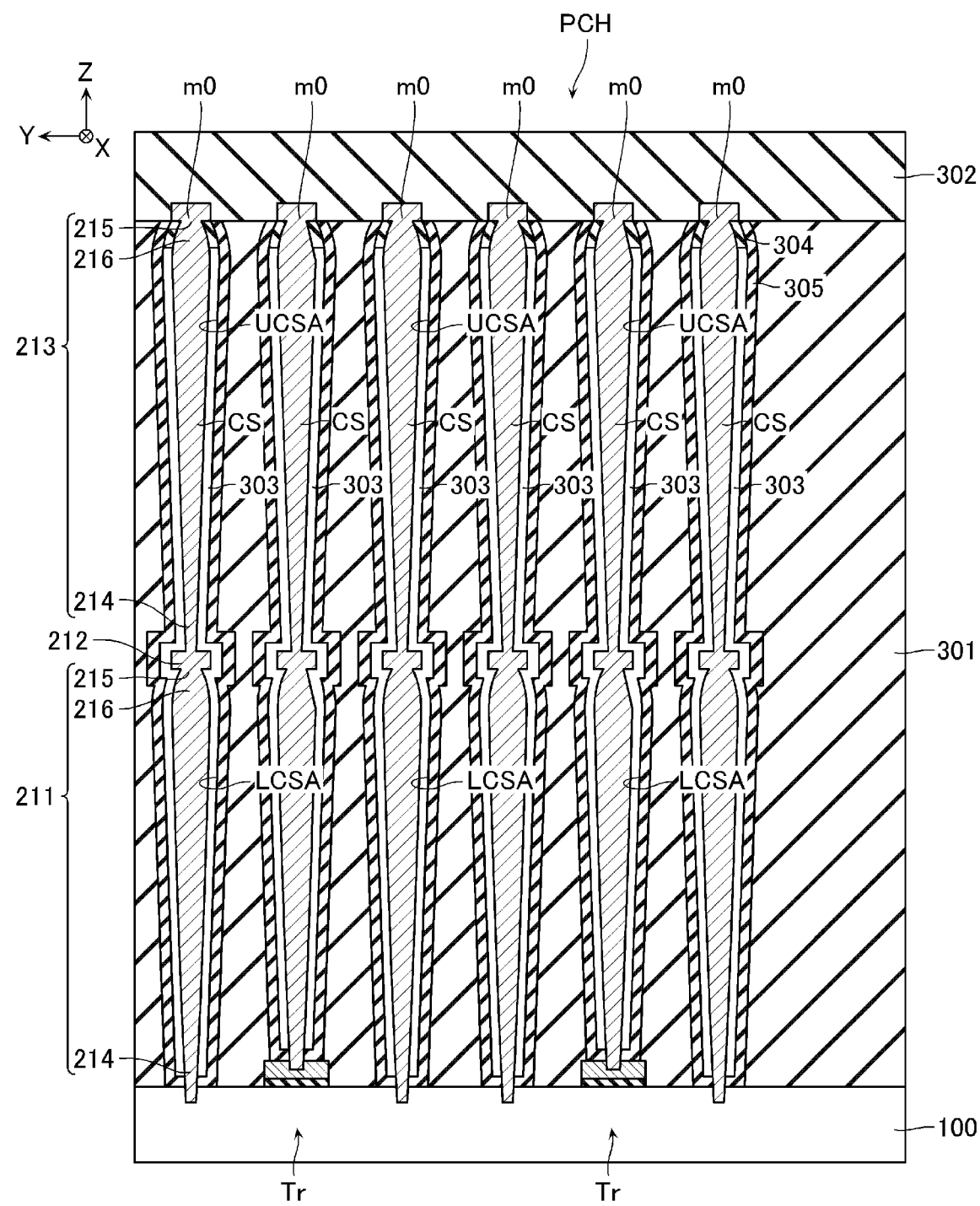
FIG. 49 illustrates a schematic cross-sectional view of a peripheral circuit according to an eighth embodiment.

FIG. 49 illustrates a schematic cross-sectional view of a configuration example of a peripheral circuit PCH according to the present embodiment. The peripheral circuit PCH according to the present embodiment includes protective films 305 similarly as in the peripheral circuit PCG (FIG. 48) according to the seventh embodiment. In the peripheral circuit PCH according to the present embodiment, each contact CS includes the contact portion 211, the connection portion 212, and the contact portion 213, similarly as in the peripheral circuit PCB (FIG. 19) according to the second embodiment.

Ninth Embodiment

Next, a semiconductor storage device according to a ninth embodiment will be described with reference to FIG. 50. In the following description, the same parts as those in the first to eighth embodiments are denoted by the same reference numerals, and the description thereof will be omitted.

Figure 50:
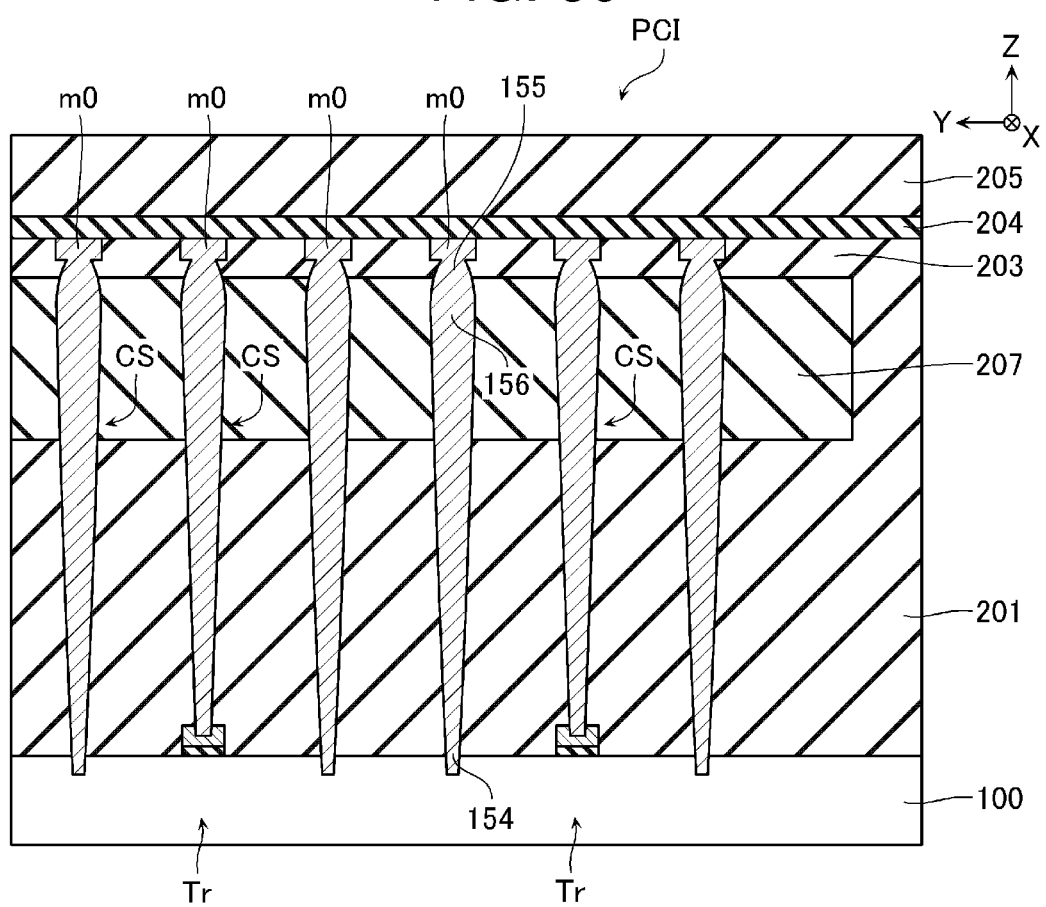
FIG. 50 illustrates a schematic cross-sectional view of a peripheral circuit according to a ninth embodiment.

FIG. 50 illustrates a schematic cross-sectional view of a configuration example of a peripheral circuit PCI according to the present embodiment. The peripheral circuit PCI according to the present embodiment is configured substantially the same as the peripheral circuit PCA (FIG. 8) according to the first embodiment. However, the peripheral circuit PCI according to the present embodiment does not include the void layer 202. The peripheral circuit PCI according to the present embodiment includes an insulating layer 207 provided between the insulating layer 201 and the insulating layer 203. The insulating layer 207 contains, for example, a low dielectric such as silicon carbide (SiC).

Furthermore, in the example of FIG. 50, the bowing portions 156 of the plurality of contacts CS are all connected to the insulating layer 207. The insulating layer 207 according to the present embodiment is provided over the region in which the plurality of transistors Tr are arranged in the X-direction and the Y-direction. Accordingly, the insulating layer 207 is commonly connected to the plurality of contacts CS connected to the plurality of transistors Tr.

In the example of FIG. 50, the opening op1 is not provided in the insulating layer 203.

In FIG. 50, the peripheral circuit PCI having a structure similar to that of the peripheral circuit PCA (FIG. 8) according to the first embodiment and including the insulating layer 207 instead of the void layer 202 is illustrated. However, for example, it is also possible to adopt a structure which is similar to that of the peripheral circuit PCB (FIG. 19) according to the second embodiment and includes the insulating layer 207 instead of the void layer 202.

Tenth Embodiment

Next, a semiconductor storage device according to the tenth embodiment will now be described with reference to FIG. 51. In the following description, the same parts as those in the first to ninth embodiments are denoted by the same reference numerals, and the description thereof will be omitted.

Figure 51:
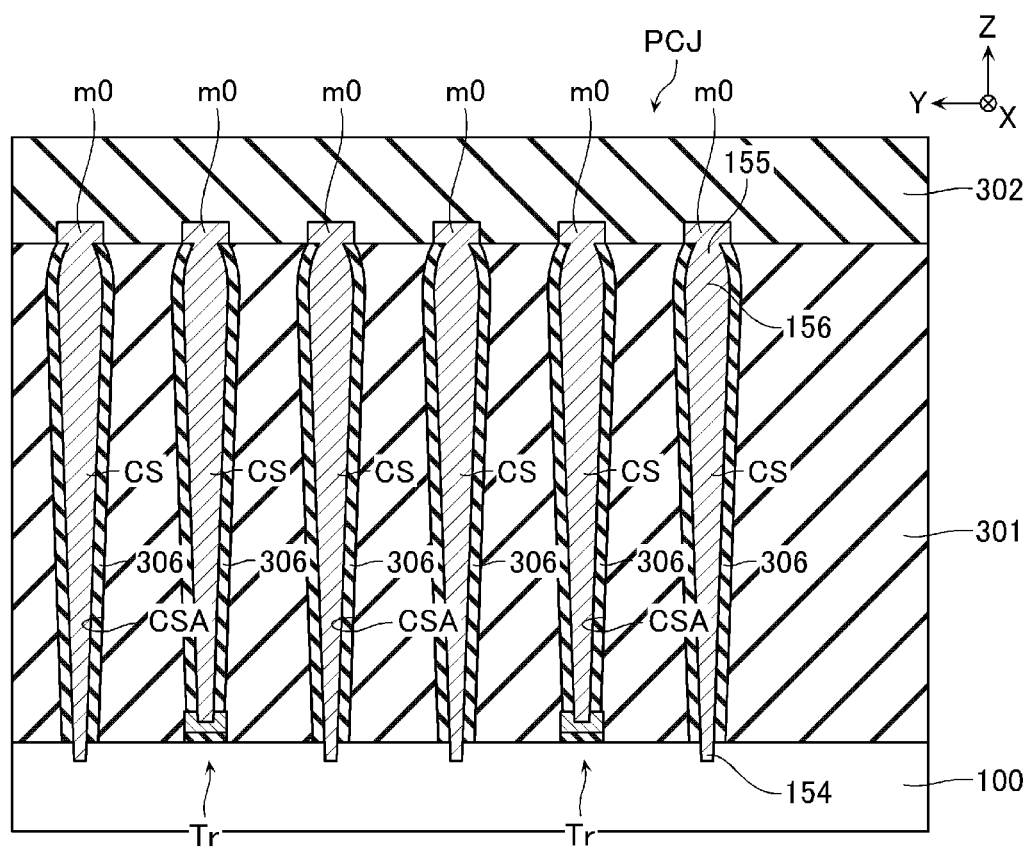
FIG. 51 illustrates a schematic cross-sectional view of a peripheral circuit according to a tenth embodiment.

FIG. 51 illustrates a schematic cross-sectional view of a configuration example of a peripheral circuit PCJ according to the present embodiment. The peripheral circuit PCJ according to the present embodiment is configured substantially the same as the peripheral circuit PCC (FIG. 30) according to the third embodiment. However, the peripheral circuit PCJ according to the present embodiment does not have the void 303 and the insulating layer 304. The peripheral circuit PCJ according to the present embodiment includes insulating layers 306 respectively provided between the inner circumferential surfaces of the contact holes CSA and the outer circumferential surfaces of the contacts CS. In the illustrated example, each insulating layer 306 covers the side surface of the contact CS from the lower end portion 154 to the upper end portion 155 of the contact CS. The insulating layer 306 contains, for example, a low dielectric such as silicon carbide (SiC).

In FIG. 51, the peripheral circuit PCJ having a structure similar to that of the peripheral circuit PCC (FIG. 30) according to the third embodiment and including the insulating layers 306 instead of the voids 303 is illustrated. However, for example, it is also possible to adopt a structure which is similar to that of the peripheral circuit PCD (FIG. 39) according to the fourth embodiment and includes the insulating layer 306 instead of the void 303.

Eleventh Embodiment

Next, a semiconductor storage device according to the eleventh embodiment will now be described with reference to FIG. 52. In the following description, the same parts as those in the first to tenth embodiments are denoted by the same reference numerals, and the description thereof will be omitted.

Figure 52:
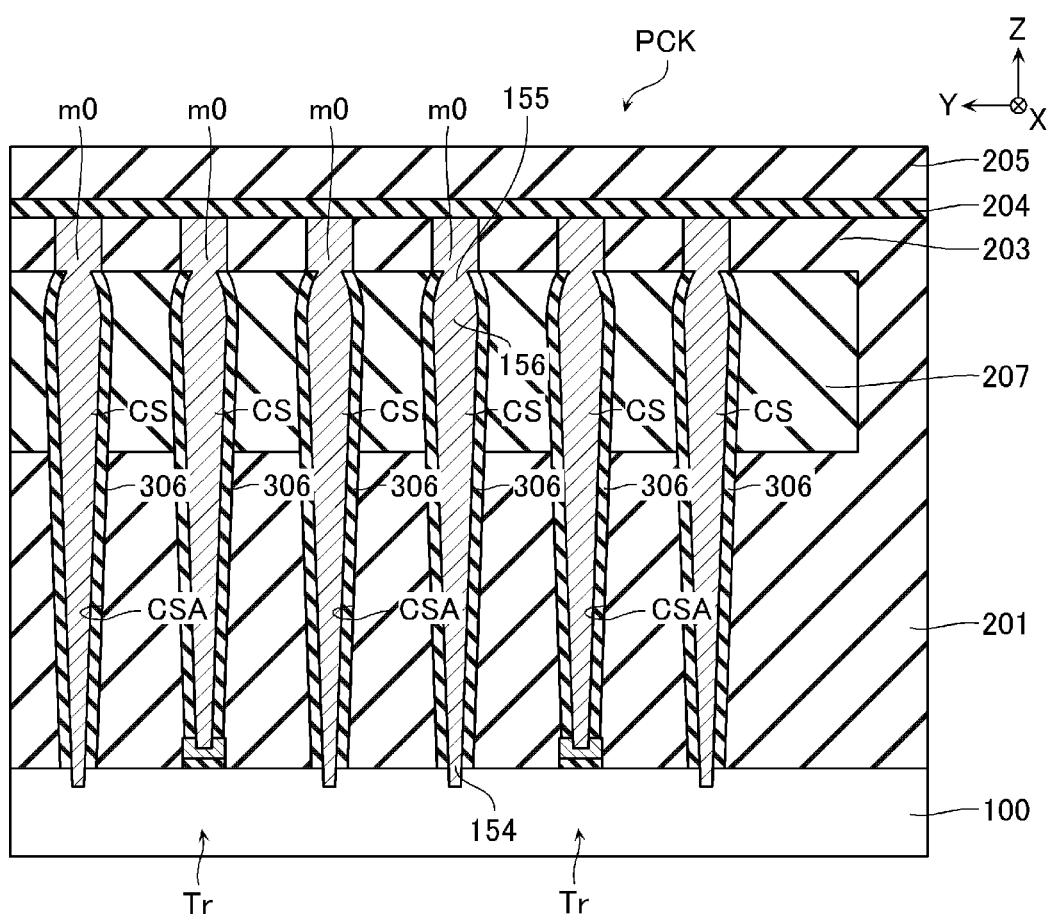
FIG. 52 illustrates a schematic cross-sectional view of a peripheral circuit according to an eleventh embodiment.

FIG. 52 illustrates a schematic cross-sectional view of a configuration example of a peripheral circuit PCK according to the present embodiment. The peripheral circuit PCK according to the present embodiment is configured substantially the same as the peripheral circuit PCE (FIG. 40) according to the fifth embodiment. However, the peripheral circuit PCK according to the present embodiment does not have the void layer 202 and the voids 303. The peripheral circuit PCK according to the present embodiment includes the insulating layer 207 (FIG. 50) of the peripheral circuit PCI according to the ninth embodiment and the insulating layers 306 (FIG. 51) of the peripheral circuit PCJ according to the tenth embodiment. In the illustrated example, the insulating layers 306 are respectively provided between the contacts CS and the insulating layers 207.

In FIG. 52, a peripheral circuit PCK having a structure similar to that of the peripheral circuit PCE (FIG. 40) according to the fifth embodiment, and including the insulating layer 207 and the insulating layers 306 instead of the void layer 202 and the voids 303 is illustrated. However, for example, it is also possible to adopt a structure which is similar to that of the peripheral circuit PCF (FIG. 47) according to the sixth embodiment and includes the insulating layer 207 and the insulating layers 306 instead of the void layer 202 and the voids 303.

Other Embodiments

Hereinabove, the first to eleventh embodiments have been illustrated. However, the embodiments described above are all examples, and the configuration, the material, and the like can be appropriately adjusted.

For example, in the peripheral circuit PCC (FIG. 30) according to the third embodiment, the void 303 is provided from the lower end portion 154 of the contact CS to a portion above the bowing portion 156. However, an insulating layer or the like may be provided in the vicinity of the lower end portion 154 of the contact CS. With this configuration, mechanical strength of the semiconductor storage device can be improved. Such a structure can also be formed, for example, by leaving a part of the sacrificial layer 303A in the process illustrated in FIG. 36. The same applies to the peripheral circuits PCD (FIG. 39), PCE (FIG. 40), PCF (FIG. 47), PCG (FIG. 48), and PCH (FIG. 49) according to the fourth to eighth embodiments.

In the example embodiments described above, a configuration in which the capacitance between contacts is reduced was illustrated for the contacts CS connected to the gate electrodes of the transistors Tr provided on the semiconductor substrate 100 or the semiconductor substrate 100. However, for example, it is also similarly possible to reduce the capacitance between other contacts connected to other configurations, such as the contact CC and the through silicon via (TSV) electrode illustrated in FIG. 3 and the like.

Figure 53:
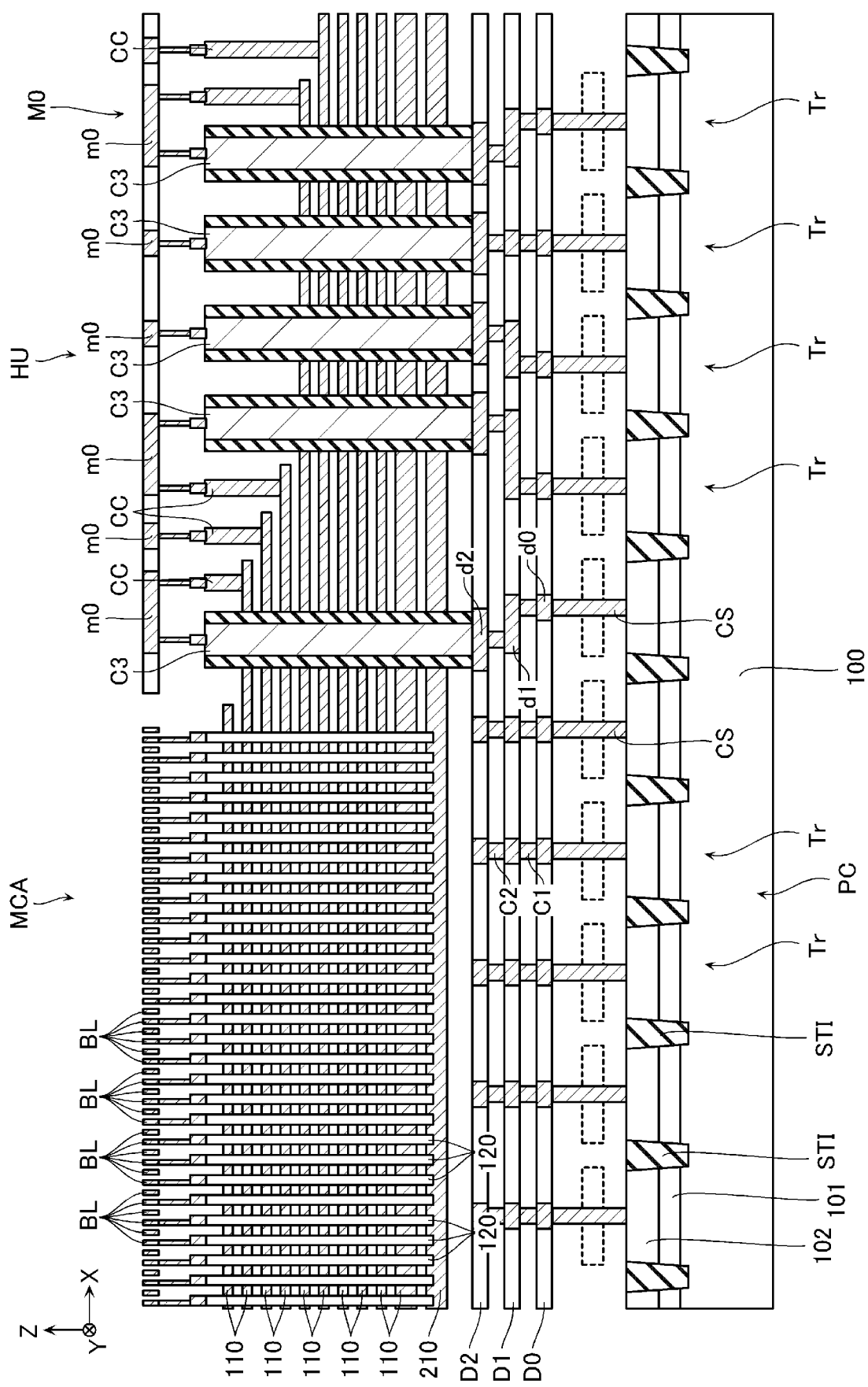
FIG. 53 illustrates a schematic cross-sectional view of a semiconductor storage device according to another embodiment.

In FIG. 3, an example in which the memory cell array MCA is directly provided on the surface of the semiconductor substrate 100 and the memory cell array MCA and the peripheral circuit PC are provided in different regions is illustrated. However, for example, as illustrated in FIG. 53, it is also possible to adopt a structure in which the memory cell array MCA is provided away from the semiconductor substrate 100 and the peripheral circuit PC is provided immediately below the memory cell array MCA.

In such a structure, the wiring layers D0, D1, and D2 may be provided below the memory cell array MCA. In addition, contacts C3 may connect the wirings m0 provided above the memory cell array MCA and the wirings d2 provided below the memory cell array MCA. In such a case, for example, it is possible to reduce the capacitance between the contacts CS connected to the semiconductor substrate 100 or the like, and it is also possible to reduce the capacitance between the contacts C3.

In the examples described above, a so-called NAND flash memory is illustrated as an example of a semiconductor storage device. However, it is also possible to employ a dynamic random access memory (DRAM) other than the NAND flash memory for semiconductor storage devices.

Also, in the examples described above, configurations of a semiconductor storage device in which the capacitance between the contacts is reduced was illustrated. However, the present disclosure is not limited to semiconductor storage devices and the configurations illustrated in the above embodiments can also be employed for device types other than semiconductor storage devices.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate;
   a first insulating layer above the substrate;
   a second insulating layer above the first insulating layer;
   a void space between the first insulating layer and the second insulating layer; and
   a plurality of contact electrodes extending in a first direction orthogonal to the substrate through the first insulating layer, the void space, and the second insulating layer, wherein
   each of the contact electrodes includes a first end facing the substrate, a second end opposite to the first end, and a first width portion between the first end and the second end, the first width portion having a width in a second direction parallel to the substrate that is greater than a width of the first end in the second direction and a width of the second end in the second direction, the first width portion being within the void space.

2. The semiconductor device according to claim 1, wherein the void space coincides with a part of a top half, in the first direction, of the plurality of contact electrodes, and does not coincide with a bottom half, in the first direction, of the plurality of contact electrodes.

3. The semiconductor device according to claim 1, wherein a first subset of the plurality of contact electrodes extends into the substrate through the first insulating layer, and a second subset of the plurality of contact electrodes does not extends into the substrate.

4. The semiconductor device according to claim 1, wherein a width of each of the contact electrodes decreases from the first width portion to the first end.

5. The semiconductor device according to claim 1, wherein
a plurality of second void spaces is provided on the plurality of contact electrodes, respectively, and
each of the second void spaces is provided around part of a corresponding one of the contact electrodes in the first insulating layer.

6. The semiconductor device according to claim 5, wherein the void space is connected to each of the second void spaces.

7. The semiconductor device according to claim 1, wherein each of the contact electrodes includes a first part having the first end and the first width portion and a second part having a second width portion and the second end, the second width portion having a width in the second direction greater than the width of the first end and the width of the second end, and the second width portion being in the second insulating layer.

8. The semiconductor device according to claim 7, wherein a width of each of the contact electrodes decreases from the second width portion to a bottom end of the second part, and from the first width portion to the first end.

9. The semiconductor device according to claim 7, wherein the void space coincides with a bottom half, in the first direction, of the first subset of the plurality of contact electrodes, and coincides with a top half, in the first direction, of the second subset of plurality of contact electrodes.

10. The semiconductor device according to claim 7, wherein
a plurality of second void spaces is provided on the plurality of contact electrodes, respectively, and
each of the second void spaces is provided around part of a corresponding one of the contact electrodes in the first insulating layer.

11. The semiconductor device according to claim 10, wherein the void space is connected to each of the second void spaces.

12. A semiconductor device, comprising:
a substrate;
an insulating layer above the substrate in a first direction;
a void between the insulating layer and the substrate in the first direction; and
a plurality of contact electrodes arranged in a second direction intersecting the first direction, each of the contact electrodes extending in the first direction through at least part of the insulating layer, wherein
each of the contact electrodes includes a first end facing the substrate, a second end opposite to the first end, and a first width portion between the first end and the second end, the first width portion having a width in the second direction greater than a width of the first end in the second direction and a width of the second end in the second direction, and
the void surrounds the first width portion of each of the contact electrodes.

13. The semiconductor device according to claim 12, further comprising:
a protective film surrounding each of the contact electrodes between the insulating layer and the void.

14. The semiconductor device according to claim 12, wherein a first subset of the plurality of contact electrodes extends into the substrate, and a second subset of the plurality of contact electrodes does not extends into the substrate.

15. The semiconductor device according to claim 12, wherein a width of each of the contact electrodes decreases from the first width portion to the first end.

16. The semiconductor device according to claim 12, wherein
each of the contact electrodes includes a first part having the first end and the first width portion and a second part having a second width portion and the second end, and
a width of each of the contact electrodes decreases from the second width portion to a bottom end of the second part, and from the first width portion to the first end.

17. The semiconductor device according to claim 16, wherein the second width portion has a width in the second direction greater than the width of the first end in the second direction and the width of the second end in the second direction.

18. The semiconductor device according to claim 16, further comprising:
a protective film between the insulating layer and the void.

19. A semiconductor device, comprising:
a substrate;
an insulating layer above the substrate in a first direction;
a void between the insulating layer and the substrate in the first direction; and
a plurality of contact electrodes arranged in a second direction intersecting the first direction, each of the contact electrodes extending in the first direction through at least part of the insulating layer, wherein
each of the contact electrodes includes a first end facing the substrate, a second end opposite to the first end, and a first width portion between the first end and the second end, the first width portion having a width in the second direction greater than a width of the first end in the second direction and a width of the second end in the second direction, and
the void extends from the first width portion to the first end.

20. The semiconductor device according to claim 19, further comprising:
a protective film surrounding each of the contact electrodes between the insulating layer and the void.

* * * * *

UNITED STATES PATENT AND TRADEMARK OFFICE
CERTIFICATE OF CORRECTION

PATENT NO. : 11,127,748 B2
APPLICATION NO. : 16/558507
DATED : September 21, 2021
INVENTOR(S) : Shizuka Kutsukake et al.

It is certified that error appears in the above-identified patent and that said Letters Patent is hereby corrected as shown below:

In the Claims

In Column 20, Claim 14, Line 14, please delete "extends" and insert --extend--.

Signed and Sealed this
Eighth Day of November, 2022

Katherine Kelly Vidal
*Director of the United States Patent and Trademark Office*